US012672449B2

(12) United States Patent
Lee et al.

(10) Patent No.: US 12,672,449 B2
(45) Date of Patent: Jun. 30, 2026

(54) DISPLAY DEVICE AND ELECTRONIC DEVICE INCLUDING THE SAME

(71) Applicant: SAMSUNG DISPLAY CO., LTD., Yongin-si (KR)

(72) Inventors: Kyung Hoe Lee, Yongin-si (KR); Cheol Gon Lee, Yongin-si (KR); Mu Kyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/664,640

(22) Filed: May 15, 2024

(65) Prior Publication Data

US 2025/0048863 A1     Feb. 6, 2025

(30) Foreign Application Priority Data

Aug. 3, 2023     (KR) ......................... 10-2023-0101624

(51) Int. Cl.
*H10K 59/131* (2023.01)
*G06F 3/041* (2006.01)
(Continued)

(52) U.S. Cl.
CPC ......... *H10K 59/131* (2023.02); *G06F 3/0412* (2013.01); *G06F 3/04164* (2019.05); *G09G 3/3233* (2013.01); *H10K 39/34* (2023.02); *H10K 59/40* (2023.02); *H10K 59/873* (2023.02); *H10K 59/88* (2023.02); *G06F 3/0446* (2019.05);

(Continued)

(58) Field of Classification Search
CPC .. G06F 3/0412; G06F 3/0416; G06F 3/04164; G06F 3/042; G06F 3/0446; G06F 3/047; G06V 40/1318; G09G 3/3233; G09G 2300/0413; G09G 2300/0819; G09G 2300/0842; G09G 2354/00;

(Continued)

(56) References Cited

U.S. PATENT DOCUMENTS

2024/0423038 A1*  12/2024  Lee ...................... H10K 59/131
2025/0048866 A1    2/2025  Lee et al.
2025/0048874 A1*   2/2025  Lee ........................ H10K 59/13

FOREIGN PATENT DOCUMENTS

CN          108681415 A      10/2018
KR    10-2021-0032608 A       3/2021
(Continued)

*Primary Examiner* — Julie Anne Watko
(74) *Attorney, Agent, or Firm* — F. CHAU & ASSOCIATES, LLC

(57)     ABSTRACT

A display device includes a substrate; a circuit layer; and an element layer. The circuit layer includes data pad lines disposed in a second sub-region and electrically connecting between data lines and a display driving circuit; data dummy lines disposed in the second sub-region, extending from a bending region, and spaced apart from the display driving circuit; and read-out pad lines disposed in the second sub-region and electrically connecting between read-out lines and a scan driving circuit. The second sub-region includes a first line group region in which the data pad lines are disposed; second line group regions in which the data dummy lines are disposed; and a third line group region in which the read-out pad lines are disposed. At least a portion of the third line group region overlaps the second line group regions.

18 Claims, 20 Drawing Sheets

(51) Int. Cl.

| | |
|---|---|
| *G09G 3/3233* | (2016.01) |
| *H10K 39/34* | (2023.01) |
| *H10K 59/40* | (2023.01) |
| *H10K 59/80* | (2023.01) |
| *H10K 59/88* | (2023.01) |
| *G06F 3/044* | (2006.01) |
| *G06V 40/13* | (2022.01) |

(52) U.S. Cl.
CPC . *G06V 40/1318* (2022.01); *G09G 2300/0413* (2013.01); *G09G 2300/0819* (2013.01); *G09G 2300/0842* (2013.01); *G09G 2354/00* (2013.01); *G09G 2360/14* (2013.01)

(58) Field of Classification Search
CPC .. G09G 2360/14; H10K 39/34; H10K 59/131; H10K 59/40; H10K 59/873; H10K 59/88
See application file for complete search history.

(56) References Cited

FOREIGN PATENT DOCUMENTS

| | | | |
|---|---|---|---|
| KR | 10-2021-0133363 A | 11/2021 | |
| KR | 10-2025-0019767 A | 2/2025 | |

\* cited by examiner

100 : MA, SBA

GL : GWL, GIL, GCL

TSL : TL1, TL2, RL

FIG. 13

SB2 : LGA1, LGA2, LGA3
DCPDL : VDPDL, VSPDL, VIPDL, VAIPDL

FIG. 15

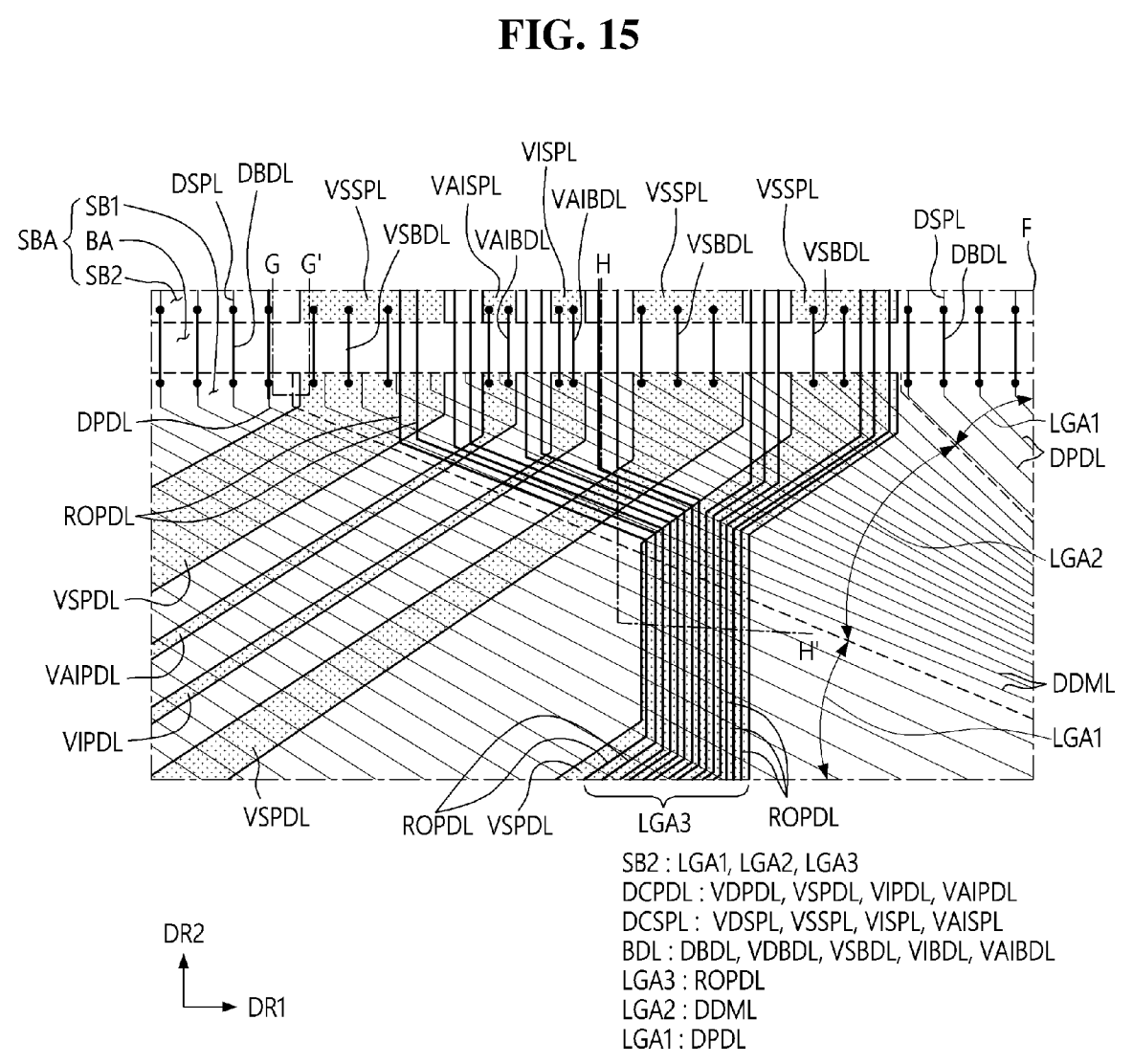

SB2 : LGA1, LGA2, LGA3
DCPDL : VDPDL, VSPDL, VIPDL, VAIPDL
DCSPL : VDSPL, VSSPL, VISPL, VAISPL
BDL : DBDL, VDBDL, VSBDL, VIBDL, VAIBDL
LGA3 : ROPDL
LGA2 : DDML
LGA1 : DPDL

SB2 : LGA1, LGA2, LGA3, LGA4
DCPDL : VDPDL, VSPDL, VIPDL, VAIPDL

SB2 : LGA1, LGA2, LGA3, LGA4
DCPDL : VDPDL, VSPDL, VIPDL, VAIPDL

DISPLAY DEVICE AND ELECTRONIC DEVICE INCLUDING THE SAME

CROSS-REFERENCE TO RELATED APPLICATION

This application claims priority under 35 U.S.C. 119 from Korean Patent Application No. 10-2023-0101624, filed on Aug. 3, 2023, in the Korean Intellectual Property Office, the disclosure of which is herein incorporated by reference in its entirety.

BACKGROUND

1. Technical Field

The present disclosure relates to a display device and an electronic device including the same.

2. Discussion of Related Art

With the advance of information-oriented society, increasing demands are being placed on display devices in connection with the manner in which images may be displayed. For example, display devices are employed in various form factors for different electronic devices including smartphones, digital cameras, laptop computers, navigation devices, and smart televisions.

In addition, the display device may incorporate one or more input functions, in addition to a function of displaying an image. For example, the display device may incorporate a touch sensing function that senses a location of a touch on the screen based on changes in capacitance. In another example, the display device may incorporate a scanning function for detecting a curvature of an object in contact with a screen based on differences in an amount of light reflected from the screen.

SUMMARY

According to an embodiment, a display device may include light emitting elements respectively corresponding to emission areas arranged in a display area where an image display function may be implemented, light emitting pixel drivers respectively electrically connected to the light emitting elements, and a display driving circuit transmitting data signals of the light emitting pixel drivers through data lines.

In addition, the display device may further include a scan driving circuit that receives sensing signals of light sensing elements that senses an amount of light, wherein the scan driving circuit may receive the sensing signals through read-out lines.

The substrate of the display device may include a main region including a display area, and a sub-region protruding from a side of the main region. The sub-region may include a bending region that may be bent, a first sub-region between the main region and the bending region, and a second sub-region overlapping the main region by the bending region having a bent shape.

The display driving circuit and the scan driving circuit may be disposed in the second sub-region.

The second sub-region may have a limited width, so pad lines connected to the scan driving circuit may overlap pad lines connected to the display driving circuit. Accordingly, parasitic capacitance and signal coupling defects may arise, which may lead to signal distortion in the pad lines connected to the scan driving circuit. As a result, it is difficult to improve the accuracy of the scanning function.

In view of the above, aspects of the present disclosure provide a display device that may improve the accuracy of the scanning function by reducing signal distortion in the pad lines.

According to an aspect of the present disclosure, a display device may include a substrate including a display area, a non-display area disposed at a periphery of the display area, a circuit layer disposed on the substrate, and an element layer disposed on the circuit layer and comprising a plurality of light emitting elements and a plurality of light sensing elements. The substrate may further include a sub-region protruding from the non-display area and on which a display driving circuit and a scan driving circuit are mounted. The circuit layer may include a plurality of light emitting pixel drivers electrically connected to of a plurality of light emitting elements, a plurality of light sensing pixel drivers electrically connected to a plurality of light sensing elements, a plurality of data lines disposed in the display area and electrically connected to a plurality of light emitting pixel drivers, a plurality of read-out lines disposed in the display area and electrically connected to the plurality of light sensing pixel drivers, a plurality of data pad lines disposed in the sub-region and electrically connecting between the plurality of data lines and the display driving circuit, and a plurality of read-out pad lines disposed in the sub-region and electrically connecting between the plurality of read-out lines and the scan driving circuit. The sub-region may include a first line group region in which the plurality of data pad lines are disposed, a second line group region disposed in the sub-region and spaced apart from the display driving circuit, wherein the second line group region is a dummy region, and a third line group region in which the plurality of read-out pad lines are disposed, wherein at least a portion of the third line group region overlaps the second line group region.

A plurality of data dummy lines may be disposed in the second line group region and on a same layer of the circuit layer as the plurality of data pad lines, wherein the second line group region may be surrounded by the first line group region in the sub-region, wherein at least a portion of the third line group region overlaps the first line group region, and wherein the plurality of read-out pad lines of the third line group region overlapping the second line group are relatively sparsely concentrated and the plurality of read-out pad lines of the third line group region overlapping the first line group are relatively densely concentrated.

The circuit layer may further include a plurality of direct current power supply lines extending from the non-display area to the sub-region and transmitting direct current powers of different voltage levels, and a plurality of direct current power pad lines disposed in the sub-region and electrically connected to the direct current power supply lines, respectively, wherein, in a portion of the third line group region overlapping the first line group region, the plurality of read-out pad lines overlap the plurality of data pad lines of the first line group region and the plurality of direct current power pad lines.

The display device may further include a plurality of holes disposed in the third line group region and penetrating the plurality of direct current power pad lines.

According to an aspect of the present disclosure, there is provided a display device comprises a substrate including a main region and a sub-region protruding from a side of the main region, a circuit layer disposed on the substrate, and an element layer disposed on the circuit layer. The main region may include a display area disposed at a center portion and a non-display area disposed at a periphery of the display area. The sub-region comprises a bending region, a first sub-region disposed between a second side of the bending region and the main region, and a second sub-region connected to the side of the bending region and on which a display driving circuit and a scan driving circuit are mounted. The display area comprises a plurality of emission areas spaced apart from each other, a non-emission area which is a space between the emission areas, and a plurality of light sensing areas disposed on the non-emission area. The element layer may include a plurality of light emitting elements disposed respectively in the plurality of emission areas and a plurality of light sensing elements respectively disposed in the plurality of light sensing areas. The circuit layer comprises a plurality of light emitting pixel drivers electrically connected to of the plurality of light emitting elements, a plurality of light sensing pixel drivers electrically connected to the plurality of light sensing elements, a plurality of data lines disposed in the display area and electrically connected to the light emitting pixel drivers, a plurality of read-out lines disposed in the display area and electrically connected to the plurality of light sensing pixel drivers, a plurality of data pad lines disposed in the second sub-region and electrically connecting between the plurality of data lines and the display driving circuit, and a plurality of read-out pad lines disposed in the second sub-region and electrically connecting between the plurality of read-out lines and the scan driving circuit. The second sub-region comprises a first line group region in which the plurality of data pad lines are disposed, a plurality of second line group regions disposed in the second sub-region, extending from the bending region, and spaced apart from the display driving circuit, wherein the second line group region is a dummy region, and a third line group region in which the plurality of read-out pad lines are disposed. At least a portion of the third line group region overlaps the plurality of second line group regions.

A plurality of data dummy lines may be disposed in the plurality of second line group regions and extend from the bending region, wherein the plurality of data dummy lines may be on a same layer of the circuit layer as the data pad lines. Each of the second line group regions is surrounded by the bending region and the first line group region.

The circuit layer may further comprise a plurality of direct current power supply lines extending from the non-display area to the first sub-region and transmitting direct current powers of different voltage levels, and a plurality of direct current power pad lines disposed in the second sub-region and electrically connected to the direct current power supply lines, respectively. In a portion of the third line group region overlapping the first line group region, the plurality of read-out pad lines overlap the plurality of data pad lines of the first line group region and the plurality of direct current power pad lines.

The plurality of direct current power pad lines may be disposed on an interlayer insulating layer covering the plurality of data pad lines and the plurality of data dummy lines. The plurality of read-out pad lines may be disposed on a first bank layer covering the plurality of direct current power pad lines. In the portion of the third line group region overlapping the first line group region, the plurality of direct current power pad lines may be interposed between the plurality of read-out pad lines and the plurality of data pad lines.

The display device may further comprise an encapsulation layer disposed on the element layer, and a touch sensor layer disposed on the encapsulating layer. The circuit layer may further comprise a plurality of touch sensor pad lines disposed in the second sub-region and electrically connecting a plurality of touch sensor lines of the touch sensor layer, respectively. The second sub-region may further comprise a fourth line group region in which the plurality of touch sensor pad lines are disposed. At least a first direct current power pad line among the direct current power pad lines comprises a first line layer and a second line layer overlapping each other. The first line layer may be disposed on an interlayer insulating layer covering the plurality of data pad lines and the plurality of data dummy lines. The plurality of read-out pad lines may be disposed on a first bank layer covering the first line layer. The second line layer may be disposed on a second bank layer covering the read-out pad lines. In a portion of the third line group region overlapping the fourth line group region, the plurality of read-out pad lines may overlap the plurality of touch sensor pad lines of the fourth line group region and the second line layer.

The plurality of touch sensor pad lines may be disposed on a buffer planarizing layer covering the second line layer and overlapping the second line layer. In another portion of the third line group region overlapping the fourth line group region, the second line layer may be interposed between the plurality of read-out pad lines and the plurality of touch sensor pad lines.

The display device may further comprise a plurality of holes disposed in the third line group region, spaced apart from each other, and penetrating the second line layer.

The touch sensor pad lines may be spaced apart from the plurality of holes.

A portion of at least one second line group region of the plurality of second line group regions may be spaced apart from the third line group region is in contact with the first line layer through a connection groove penetrating the first bank layer and the second bank layer.

Direct current powers may comprise a first power and a second power for driving the plurality of light emitting pixels, a first initialization power for initializing the plurality of light emitting pixel drivers, and a second initialization power for initializing the plurality of light sensing pixel drivers.

According to an aspect of the present disclosure, an electronic device may comprise a bracket, a display device disposed on the bracket and emitting light for an image display, and a cover window disposed on the display device. The display device may comprise a substrate including a main region and a sub-region protruding from a side of the main region, a circuit layer disposed on the substrate, an element layer disposed on the circuit layer, an encapsulating layer disposed on the element layer, and a touch sensor layer disposed on the encapsulating layer. The main region may comprise a display area disposed at a center portion and a non-display area disposed at a periphery of the display area. The sub-region may comprise a bending region having a bent form, a first sub-region disposed between a first side of the bending region and the main region, and a second sub-region connected to a second side of the bending region and on which a display driving circuit and a scan driving circuit are mounted. The display area may comprise a plurality of emission areas spaced apart from each other, a non-emission area which is a space between the emission areas, and a plurality of light sensing areas disposed on the non-emission area. The element layer may comprise a plurality of light emitting elements disposed respectively in the emission areas and a plurality of light sensing elements respectively disposed in the plurality of light sensing areas.

The circuit layer may comprise a plurality of light emitting pixel drivers electrically connected to of the light emitting elements, a plurality of light sensing pixel drivers electrically connected to the light sensing elements, a plurality of data lines disposed in the display area and electrically connected to the plurality of light emitting pixel drivers, a plurality of read-out lines disposed in the display area and electrically connected to the plurality of light sensing pixel drivers, a plurality of data pad lines disposed in the second sub-region and electrically connecting between the plurality of data lines and the display driving circuit, a plurality of data dummy lines disposed in the second sub-region, extending from the bending region, and spaced apart from the display driving circuit, and a plurality of read-out pad lines disposed in the second sub-region and electrically connecting between the plurality of read-out lines and the scan driving circuit. The second sub-region comprises a first line group region in which the plurality of data pad lines are disposed, a second line group region in which the plurality of data dummy lines are disposed and spaced apart from each other, and a third line group region in which the plurality of read-out pad lines are disposed. At least a portion of the third line group region overlaps the plurality of second line group regions.

The data dummy lines may be on a same layer of the circuit layer as the data pad lines. Each of the second line group regions may be surrounded by the bending region and the first line group region.

The circuit layer may further comprise a plurality of direct current power supply lines extending from the non-display area to the first sub-region and transmitting direct current powers of different voltage levels, and a plurality of direct current power pad lines disposed in the second sub-region and electrically connected to the direct current power supply lines, respectively. In a portion of the third line group region overlapping the first line group region, the plurality of read-out pad lines overlap the plurality of data pad lines of the first line group region and the plurality of direct current power pad lines.

The plurality of direct current power pad lines may be disposed on an interlayer insulating layer covering the plurality of data pad lines and the plurality of data dummy lines. The plurality of read-out pad lines may be disposed on a first bank layer covering the plurality of direct current power pad lines. In the portion of the third line group region overlapping the first line group region, the plurality of direct current power pad lines may be interposed between the plurality of read-out pad lines and the plurality of data pad lines.

The circuit layer further may comprise a plurality of touch sensor pad lines disposed in the second sub-region and electrically connected to a plurality of touch sensor lines of the touch sensor layer, respectively. The second sub-region may further comprise a fourth line group region in which the plurality of touch sensor pad lines are disposed. At least one direct current power pad line among the direct current power pad lines may comprise a first line layer and a second line layer overlapping each other. The first line layer may be disposed on an interlayer insulating layer covering the plurality of data pad lines and the plurality of data dummy lines. The plurality of read-out pad lines may be disposed on a first bank layer covering the first line layer. The plurality of second line layer may be disposed on a second bank layer covering the plurality of read-out pad lines. In a portion of the third line group region overlapping the fourth line group region, the plurality of read-out pad lines overlap the touch sensor pad lines of the plurality of fourth line group region and the plurality of second line layer.

The plurality of touch sensor pad lines may be disposed on a buffer planarizing layer covering the second line layer and overlap the second line layer. In the portion of the third line group region overlapping the fourth line group region, the second line layer may be interposed between the plurality of read-out pad lines and the plurality of touch sensor pad lines.

The display device may further comprise a plurality of holes disposed in the third line group region, spaced apart from each other and penetrating the second line layer.

The touch sensor pad lines may be spaced apart from the plurality of holes.

A portion of the second line group region spaced apart from the third line group region may be in contact with the first line layer through a connection groove penetrating the first bank layer and the second bank layer.

Direct current powers may comprise a first power and a second power for driving the plurality of light emitting pixels, a first initialization power for initializing the plurality of light emitting pixel drivers, and a second initialization power for initializing the plurality of light sensing pixel drivers.

The display device according to embodiments may include a substrate, a circuit layer, and an element layer. The substrate includes a main region and a sub-region that protrudes from a side of the main region.

The sub-region may include a bending region having a bent shape, a first sub-region disposed between a first side of the bending region and the main region, and a second sub-region connected to a second side of the bending region and in which the display driving circuit and the scan driving circuit are mounted. The element layer may include light-emitting elements respectively disposed in emission areas of the display area, and light sensing elements respectively disposed in light sensing areas of the display area.

The circuit layer may include light emitting pixel drivers electrically connected to each of the light emitting elements, light sensing pixel drivers electrically connected to each of the light sensing elements, data lines electrically connected to the light emitting pixel drivers, read-out lines electrically connected to the light sensing pixel drivers, data pad lines disposed in the second sub-region and electrically connected between the data lines and the display driving circuit, data dummy lines disposed in the second sub-region, extending from the bending region and spaced apart from the display driving circuit, and read-out pad lines disposed in the second sub-region and electrically connecting the read-out lines and the scan driving circuit.

The second sub-region may include a first line group region in which data pad lines may be disposed, second line group regions in which data dummy lines may be disposed and spaced apart from each other, and a third line group region in which read-out pad lines may be disposed. At least a portion of the third line group region may overlap with the second line group regions.

In this case, the portion of the read-out pad lines arranged in the third line group region that overlaps with the data pad lines in the first line group region may be relatively small, and thus, the defect in which light sensing signals of the readout pad lines are distorted by data signals of the data pad lines can be reduced.

In addition, according to embodiments, the circuit layer may further include direct current power supply lines disposed in a non-display area and transmitting direct current powers of different voltage levels and direct current power supply lines which are disposed in the second sub-region and electrically connected to the direct current power supply lines, respectively. Some other areas of the third line group region may overlap with the first line group area and the direct current power pad lines.

That is, some other areas of the third line group region that overlap with the first line group region, rather than the second line group region, may further overlap with the direct current power pad lines. In this way, the light-sensing signals of the read-out pad lines can be maintained relatively stable by the direct current power supplies of the direct current power pad lines, and thus the distortion of the light-sensing signals can be further reduced.

However, effects according to embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which:

FIG. 13 is a cross-sectional view taken along line E-E' of FIG. 12;

FIG. 15 is an enlarged view showing part F of FIG. 14;

DETAILED DESCRIPTION

Figure 1:
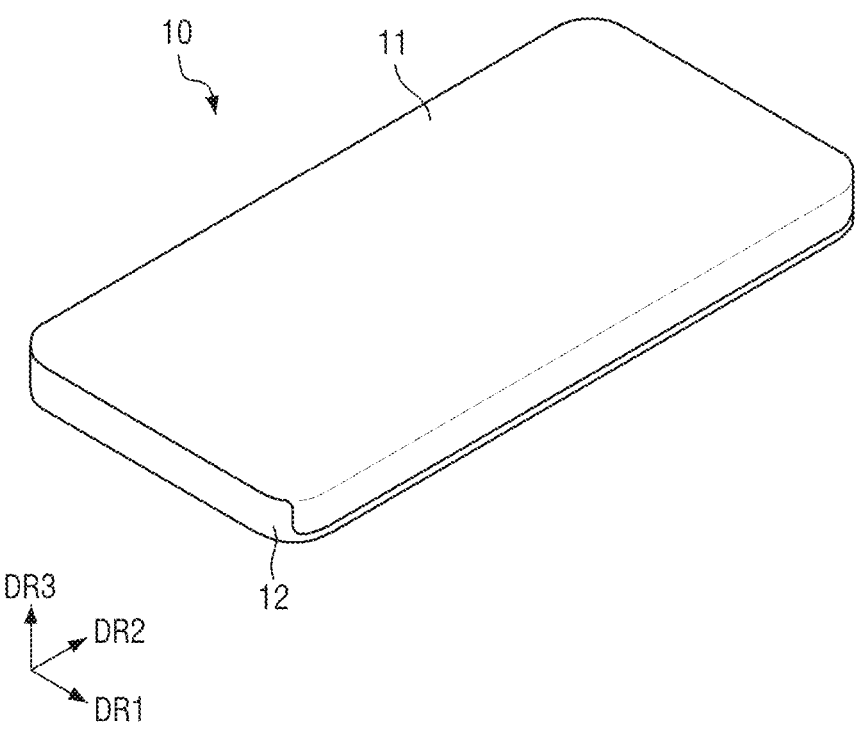
FIG. 1 is a perspective view showing an electronic device according to an embodiment.

Embodiments of the present disclosure will now be described more fully hereinafter with reference to the accompanying drawings. Embodiments may, however, be provided in different forms and should not be construed as limiting. The same reference numbers indicate the same components throughout the present disclosure. In the accompanying figures, the thickness of layers and regions may be exaggerated for clarity.

Some of the parts that are not associated with the description may not be referenced in order to clearly describe embodiments of the present disclosure.

It will also be understood that when a layer is referred to as being "on" another layer or substrate, the layer can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second objects, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms may be used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the present disclosure herein.

The terms "about" or "approximately" as used herein are inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within about ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
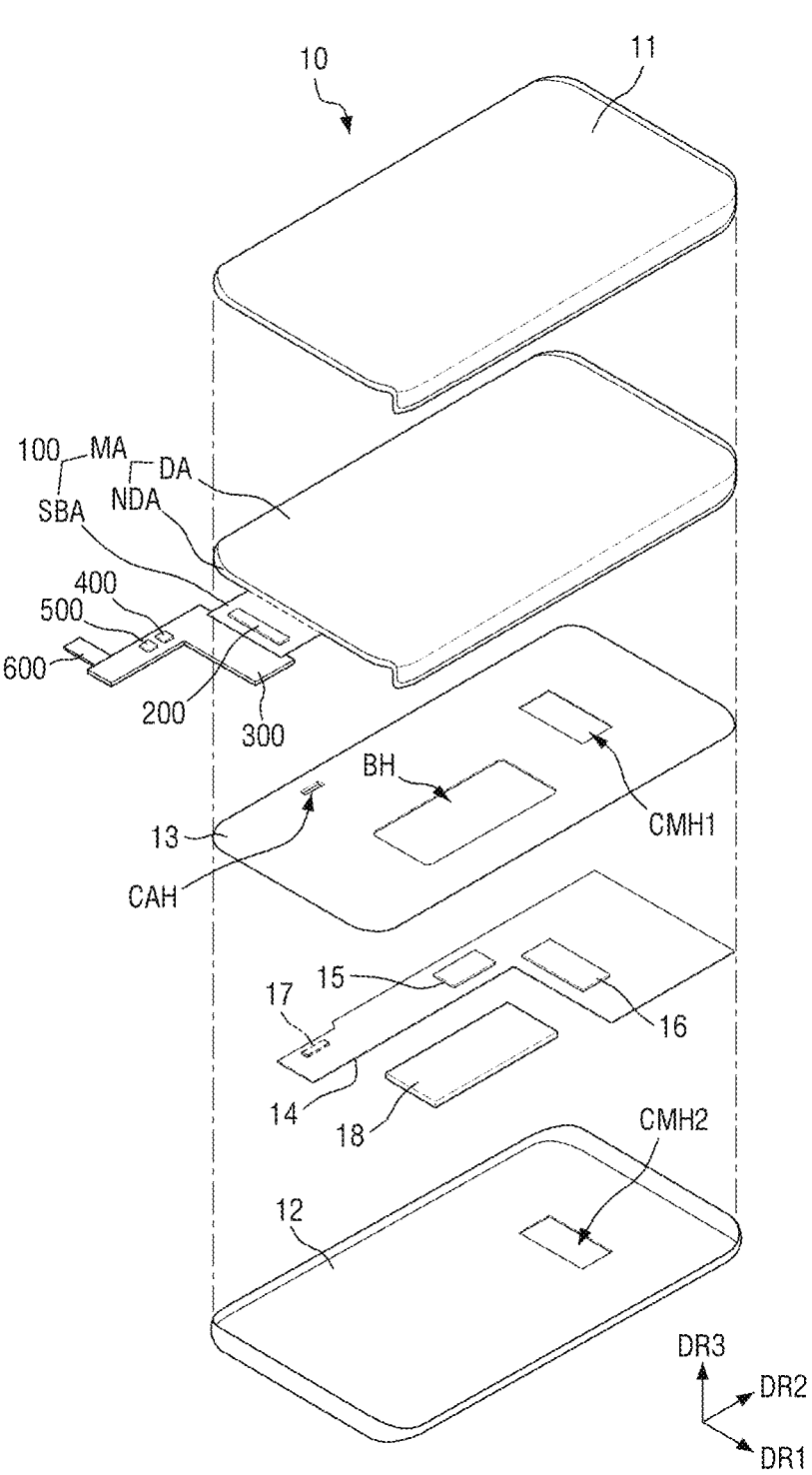
FIG. 2 is an exploded perspective view of the electronic device shown in FIG. 1.

FIG. 1 is a perspective view showing an electronic device according to an embodiment. FIG. 2 is an exploded perspective view of the electronic device shown in FIG. 1.

Referring to FIG. 1, an electronic device 10 according to an embodiment is a device may include a display area. The electronic device 10 may display an image in the display area. The electronic device 10 may provide portability. For example, the electronic device 10 may be a portable electronic device such as a mobile phone, a smartphone, a tablet personal computer (PC), a smart watch, a watch phone, a mobile communication terminal, an electronic notebook, an electronic book, a portable multimedia player (PMP), a navigation device or an ultra-mobile PC (UMPC). However, the electronic device 10 according to an embodiment is not limited to a portable electronic device, and may be a large-sized device such as a television, a laptop computer, a monitor, a billboard, or an Internet-of-Things (IoT) device.

The electronic device 10 according to an embodiment may include a cover window 11 and a lower cover 12, which may be provided as a housing to protect a display device 100 (see FIG. 2).

Referring to FIG. 2, the electronic device 10 may further include the display device 100, a bracket 13, and a main circuit board 14. The display device 100, the bracket 13, and the main circuit board 14 may be accommodated between the cover window 11 and the lower cover 12.

The display device 100 may include a main region MA and a sub-region SBA. The main region MA may include a display area DA where an image is displayed and a non-display area NDA around the display area DA. The sub-region SBA may protrude from a side of the main region MA.

The display device 100 may further include a display driving circuit 200 disposed in the sub-region SBA, a display circuit board 300 bonded to a side of the sub-region SBA, a touch driving circuit 400 and a scan driving circuit 500 mounted on the display circuit board 300, and a cable 600 extending from a side of the display circuit board 300.

In the present specification, a first direction DR1 may be a direction parallel to a short side of the electronic device 10 in plan view, that is, a horizontal direction of the electronic device 10. A second direction DR2 may be a direction parallel to a long side of the electronic device 10 in plan view, that is, a vertical direction of the electronic device 10. A third direction DR3 may be a thickness direction of the electronic device 10 perpendicular to a plane formed by the first direction DR1 and the second direction DR2.

The electronic device 10 may have a rectangular shape in plan view. For example, the electronic device 10 may have a short side in the first direction DR1 and a long side in the second direction DR2. A corner where the short side in the first direction DR1 and the long side in the second direction DR2 meet may be right-angled or rounded with a predetermined curvature. The planar shape of the electronic device 10 is not limited to the rectangular shape, and may be formed in another shape, such as a polygonal shape, a circular shape or an elliptical shape.

The cover window 11 may be disposed on the display device 100 to cover a top surface of the display device 100. The cover window 11 may serve to protect the top surface of the display device 100. The cover window 11 may include a light transmitting portion that is transparent and a light blocking portion that is opaque. The light transmitting portion may overlap the display area DA of the display device 100 in the third direction DR3, and the light blocking portion may overlap the non-display area NDA of the display device 100 in the third direction DR3.

The cover window 11 may include a top surface portion forming the top surface of the electronic device 10, a left surface portion forming the left side surface of the electronic device 10, and a right surface portion forming the right side surface of the electronic device 10. The left surface portion of the cover window 11 may extend from the left side of the top surface portion, and the right surface portion thereof may extend from the right side of the top surface portion. Each of the top, left, and right surface portions of the cover window 11 may include the light transmitting portion and the light blocking portion.

The light transmitting portion of the cover window 11 may be disposed on most of each of the top, left, and right surface portions of the cover window 11. The light blocking portion of the cover window 11 may be disposed at the upper edge and lower edge of the top surface portion of the cover window 11, the upper edge, left edge, and lower edge of the left surface portion of the cover window 11, and the upper edge, right edge, and lower edge of the right surface portion of the cover window 11.

The display device 100 may be disposed below the cover window 11. That is, the cover window 11 may be disposed on the display device 100. The display device 100 may include the main region MA and the sub-region SBA protruding from a side of the main region MA.

The main region MA may include the display area DA displaying an image and the non-display area NDA that is a peripheral area of the display area DA. The display area DA may be disposed in most of the main region MA. The display area DA may be disposed at the center of the main region MA. The non-display area NDA may be disposed outside the display area DA. The non-display area NDA may be an edge area of the main region MA.

The sub-region SBA may protrude from a side of the main region MA in the second direction DR2. The length of the sub-region SBA in the first direction DR1 may be less than or equal to the length of the main region MA in the first direction DR1. The length of the sub-region SBA in the second direction DR2 may be less than the length of the main region MA in the second direction DR2, but is not limited thereto. Since a part of the sub-region SBA may be transformed to be bent, another part of the sub-region SBA may overlap the main region MA in the third direction DR3.

The display driving circuit 200 may be arranged in the sub-region SBA.

The display device 100 may include a top surface portion facing the top surface portion of the cover window 11, a left surface portion facing the left surface portion of the cover window 11, and a right surface portion facing the right surface portion of the cover window 11. The left surface portion of the display device 100 may extend from the left side of the top surface portion, and the right surface portion of the display device 100 may extend from the right side of the top surface portion. Each of the top, left, and right surface portions of the display device 100 may include the display area DA and the non-display area NDA.

The display area DA may be disposed on most of each of the top, left, and right surface portions of the display device 100.

The non-display area NDA may be disposed at the upper edge and lower edge of the top surface portion of the display device 100, the upper edge, left edge, and lower edge of the left surface portion of the display device 100, and the upper edge, right edge, and lower edge of the right surface portion of the display device 100.

The display driving circuit 200 may be mounted on the sub-region SBA of the display device 100, and the display circuit board 300 may be attached thereto.

An end of the display circuit board 300 may be attached onto pads disposed on the lower edge of the sub-region SBA of the display device 100 by using an anisotropic conductive film. The display circuit board 300 may be a flexible printed circuit board (FPCB) which is bendable, a rigid printed circuit board (PCB) which maintains a flat shape, or a composite printed circuit board having a portion formed of the rigid printed circuit board and a portion formed of the flexible printed circuit board.

Based on control signals and power voltages supplied from the display circuit board 300, the display driving circuit 200 may output data signals Vdata to data lines DL (see FIG. 9), respectively. The data signals Vdata may be output by of light emitting pixel drivers PXD (see FIG. 8) of the display area DA.

The display driving circuit 200 may be provided as an integrated circuit (IC) and mounted on the sub-region SBA of the display device 100. The display driving circuit 200 mounted on the sub-region SBA by a chip on glass (COG) method, a chip on plastic (COP) method, or an ultrasonic method. However, this is only an example, and an embodiment is not limited thereto. For example, the display driving circuit 200 may be mounted on the display circuit board 300.

According to an embodiment, the touch driving circuit 400 and the scan driving circuit 500 may be further mounted in the sub-region SBA of the display device 100. According to an embodiment, as shown in FIG. 2, the touch driving circuit 400 and the scan driving circuit 500 may be mounted on the display circuit board 300. The touch driving circuit 400 may be electrically connected to a touch sensor layer 150 (see FIG. 4) of the display device 100.

The touch driving circuit 400 may apply touch driving signals to first driving lines TL1 (see FIG. 11) and second driving lines TL2 (see FIG. 11) of the touch sensor layer 150, and detect changes in the charge of capacitance based on touch sensing signals received from sensing lines RL (see FIG. 11) and to determine whether there is a touch or approach of a user. The user's touch means that an object such as the user's finger or a pen comes into direct contact with the top surface of the cover window 11 disposed on the touch sensor layer. The user's approach means that the object such as the pen or the user's finger hovers over the top surface of the cover window 11. The touch driving circuit 400 may output touch data including the touch coordinates corresponding to the touch or the approach of the user to a main processor 15.

The scan driving circuit 500 may be electrically connected to light sensing pixel drivers (see FIG. 8) of the display device 100. The scan driving circuit 500 may periodically collect light sensing signals of light sensing elements PD (see FIG. 10) disposed in light sensing areas ODA (see FIG. 6) of the main region MA through the light sensing pixel drivers DPD. Further, based on the collected light sensing signals, the scan driving circuit 500 may output, to the main processor 15, scanning data about the shape of an object in contact with a screen by detecting differences in the amount of light reflected by the object in contact with the screen.

The bracket 13 may be disposed under the display device 100. The bracket 13 may include plastic, metal, or both plastic and metal. The bracket 13 may include a first camera hole CMH1 into which a camera 16 may be inserted, a battery hole BH into which a battery 18 may be disposed, and a cable hole CAH, which the cable 600 connected to the display circuit board 300 may pass through.

The main circuit board 14 and a battery 18 may be disposed under the bracket 13. The main circuit board 14 may be a printed circuit board or a flexible printed circuit board. The main circuit board 14 may include a main processor 15, the camera 16, and a main connector 17. The main processor 15 may be formed as an integrated circuit.

The camera 16 may be disposed on the top surface and the bottom surface of the main circuit board 14. The main processor 15 may be disposed on the top surface of the main circuit board 14. The main connector 17 may be disposed on the bottom surface of the main circuit board 14.

The main processor 15 may control all functions of the electronic device 10. For example, the main processor 15 may output digital video data to the display driving circuit 200 through the display circuit board 300 such that the display device 100 displays an image. In addition, the main processor 15 may receive touch data including touch coordinates from the touch driving circuit 400, determine whether or not the user has touched or approached the touch sensor layer 150, and perform an operation corresponding to the touch input or approach input. For example, the main processor 15 may perform an operation or execute an application indicated by an icon touched by the user.

In addition, the main processor 15 may receive scanning data from the scan driving circuit 500. The main processor 15 may perform an operation or execute an application based on whether or not the scanning data is valid. The main processor 15 may be an application processor formed of an integrated circuit, a central processing unit, or a system chip.

The camera 16 may process an image frame of a still image or video obtained by an image sensor in a camera mode and output it to the main processor 15.

The cable 600 passing through the cable hole CAH of the bracket 13 may be connected to the main connector 17. Thus, the main circuit board 14 may be electrically connected to the display circuit board 300.

The battery 18 may be offset from the main circuit board 14. For example, the battery 18 may be disposed so as not to overlap the main circuit board 14 in the third direction DR3. The battery 18 may overlap the battery hole BH of the bracket 13 in the third direction DR3.

In addition, the main circuit board 14 may be equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 12 may be disposed below the main circuit board 14 and the battery 18. The lower cover 12 may be fixed to the bracket 13. For example, the lower cover 12 may be fastened to the bracket 13. The lower cover 12 may form the upper side surface, lower side surface, and bottom surface of the electronic device 10. The lower cover 12 may include, for example, plastic, metal, or both plastic and metal.

The lower cover 12 may include a second camera hole CMH2 through which the bottom surface of the camera 16 may be exposed. The position of the camera 16 and the positions of the first camera hole CMH1 and the second camera hole CMH2 corresponding to the camera 16 are not limited to embodiments illustrated in FIG. 2.

Figure 3:
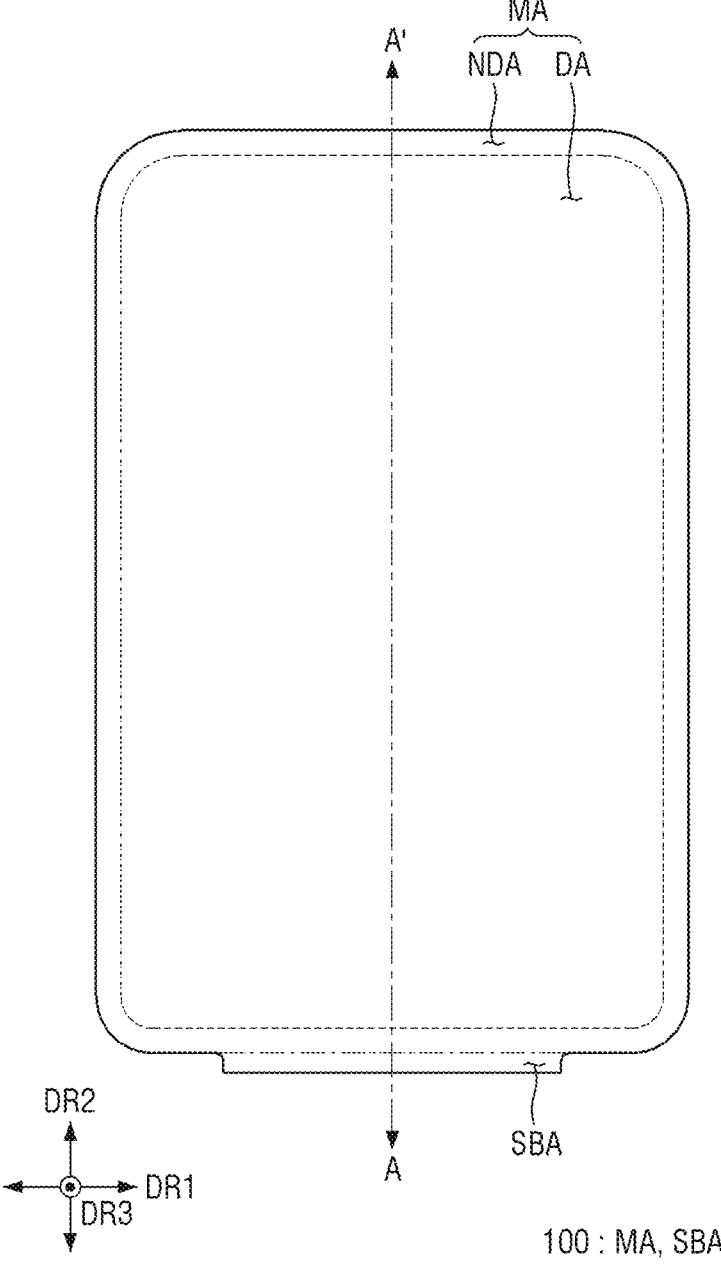
FIG. 3 is a plan view illustrating the display device of FIG. 2.
Figure 4:
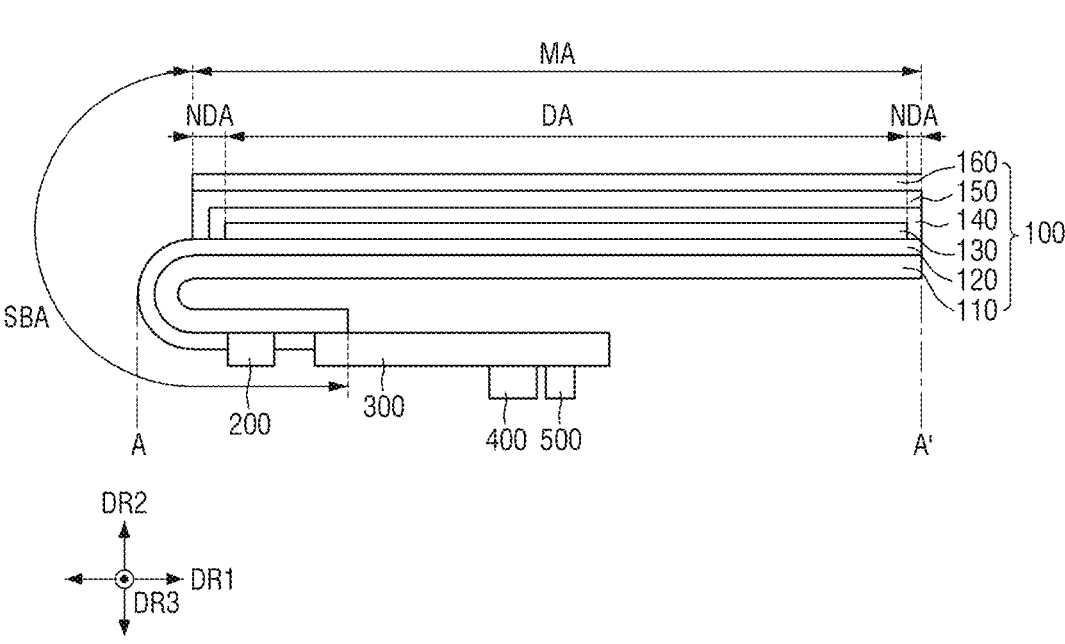
FIG. 4 is a cross-sectional view taken along line A-A' of FIG. 3.
Figure 5:
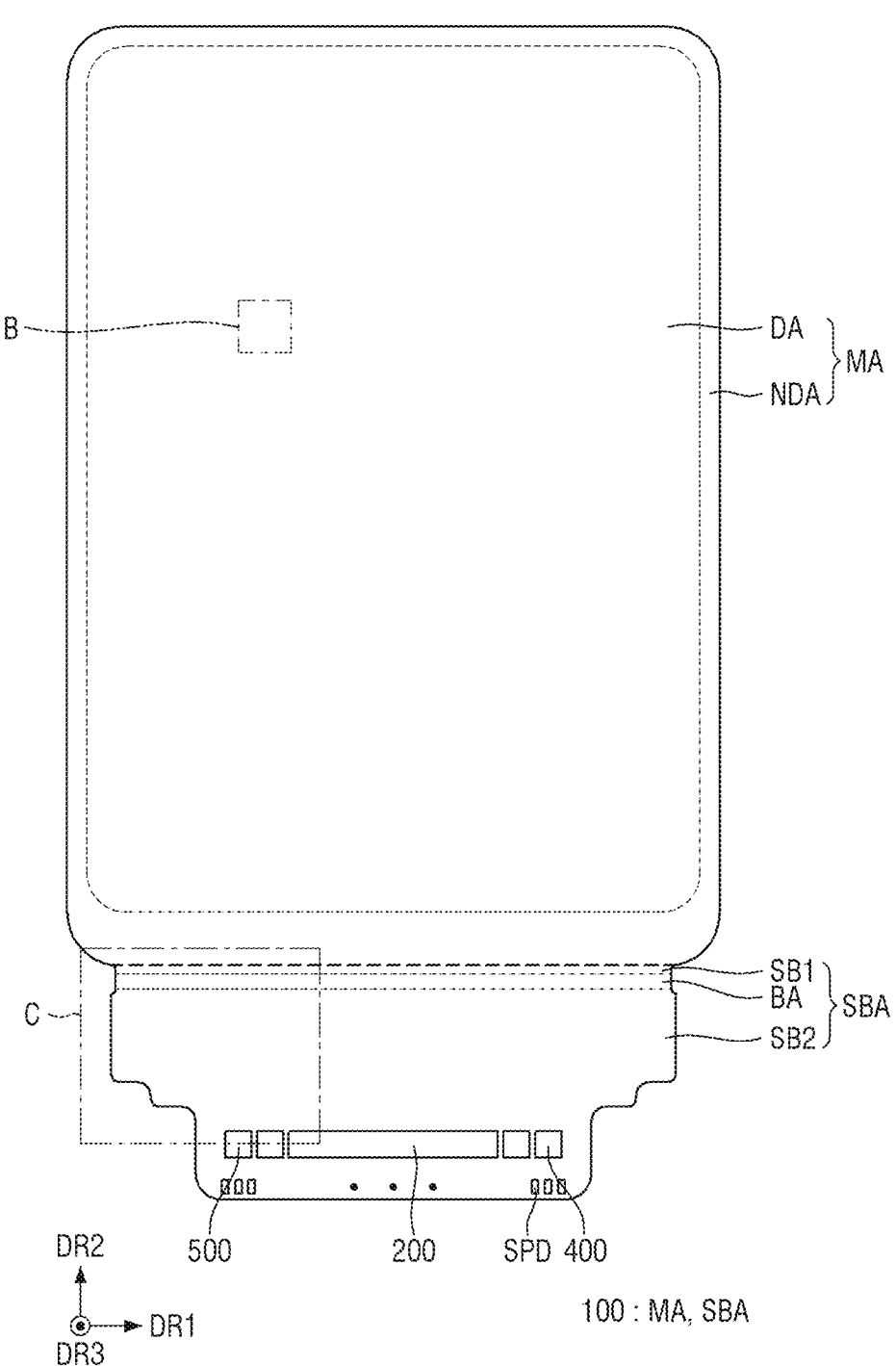
FIG. 5 is a plan view illustrating the main region and the sub-region of the display device shown in FIG. 2.
Figure 6:
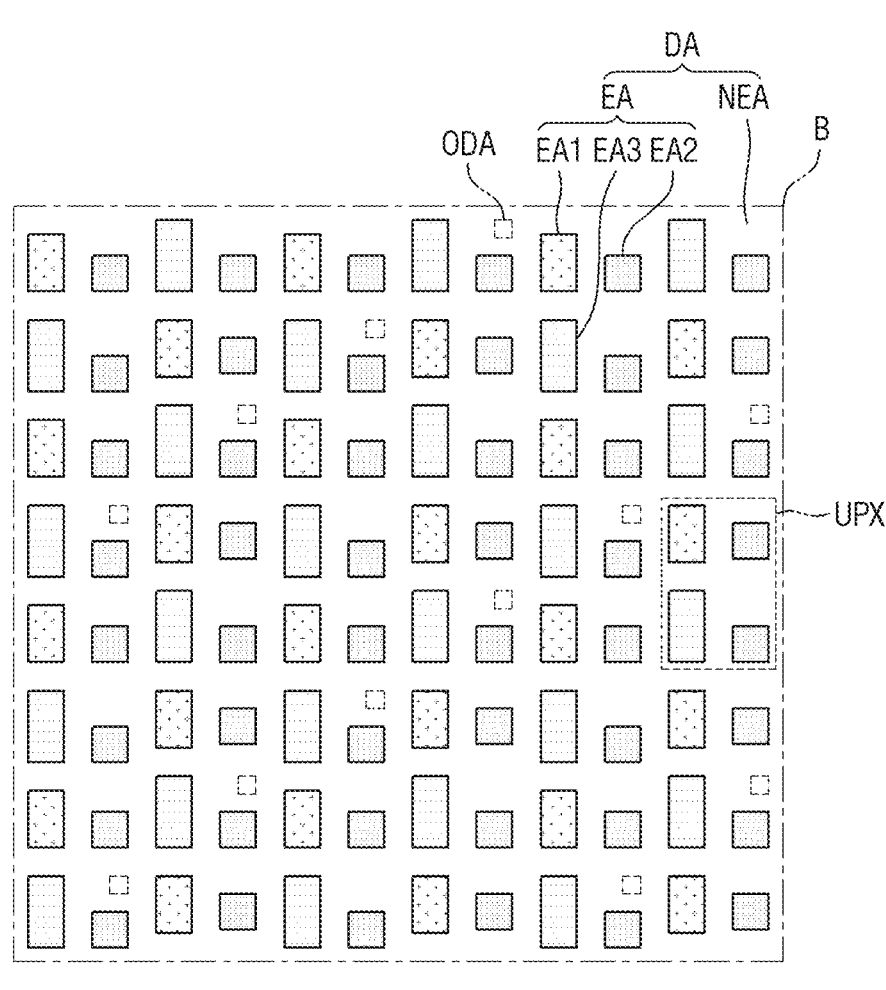
FIG. 6 is a layout diagram illustrating part B of FIG. 5.
Figure 6:
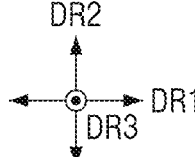

FIG. 3 is a plan view illustrating the display device 100 of FIG. 2. FIG. 4 is a cross-sectional view taken along line A-A' of FIG. 3. FIG. 5 is a plan view illustrating the main region and the sub-region of the display device 100 shown in FIG. 2. FIG. 6 is a layout diagram illustrating part B of FIG. 5.

FIG. 3 and FIG. 4 illustrate the display device 100 in which a part of the sub-region SBA is in a bent state.

The display device 100 may be a light emitting display device such as an organic light emitting display using an organic light emitting diode, a quantum dot light emitting display including a quantum dot light emitting layer, an inorganic light emitting display including an inorganic semiconductor, or a micro light emitting display using a micro or nano light emitting diode (LED). In the following description, it may be assumed that the display device 100 is an organic light emitting display device. However, the present disclosure is not limited thereto.

The display device 100 may be formed to be flat, but is not limited thereto. For example, the display device 100 may include a curved portion formed at left and/or right ends, and the curved portion may have a constant curvature or a varying curvature. In addition, the display device 100 may be formed of a flexible material, which may be curved, bent, folded, or rolled.

Referring to FIG. 3, at least one surface of the display device 100 includes the main region MA from which light for displaying an image is emitted. The main region MA includes the display area DA in which emission areas EA (see FIG. 6) may be arranged, and the non-display area NDA disposed around the display area DA.

The display area DA may, in plan view, be formed in a rectangular shape having short sides in the first direction DR1 and long sides in the second direction DR2 intersecting the first direction DR1. The corner where the short side in the first direction DR1 and the long side in the second direction DR2 meet may be rounded to have a predetermined curvature or may be angled (e.g., right-angled). The planar shape of the display area DA is not limited to the rectangular shape, and may be formed in another shape, such as a polygonal shape, a circular shape or an elliptical shape.

The display area DA may occupy a portion of the main region MA. The display area DA may be disposed at a center portion of the main region MA.

Referring to FIG. 4, the display device 100 may further include the sub-region SBA, which may protrude from a side of the main region MA. The sub-region SBA may be a region protruding from the non-display area NDA of the main region MA to a side in the second direction DR2. In an embodiment in which a part of the sub-region SBA is bent, another part of the sub-region SBA may be disposed on the rear surface of the display device 100. For example, the sub-region SBA may include a bent portion and a flat portion.

The display device 100 according to an embodiment may include a substrate 110 including the main region MA and the sub-region SBA, a circuit layer 120 disposed on the substrate 110, an element layer 130 disposed on the circuit layer 120, an encapsulation layer 140 disposed on the element layer 130, and the touch sensor layer 150 disposed on the encapsulation layer 140.

The display device 100 may further include a polarization layer 160 disposed on the touch sensor layer 150. The polarization layer 160 may reduce reflection of external light.

The substrate 110 may be formed of an insulating material such as a polymer resin. For example, the substrate 110 may be formed of polyimide. The substrate 110 may be a flexible substrate which can be bent, folded or rolled. According to an embodiment, the substrate 110 may be formed of an insulating material such as glass or the like.

Referring to FIGS. 4 and 5, the substrate 110 (shown in FIG. 4) may include the main region MA and the sub-region SBA. The main region MA may include the display area DA, which may be disposed at a center portion, and the non-display area NDA, which may be disposed at the periphery of the display area DA. The sub-region SBA may protrude from a side of the main region MA in the second direction DR2.

The sub-region SBA may include a bending region BA that may have a bent shape, a first sub-region SB1 disposed between a side of the bending region BA and the main region MA, and a second sub-region SB2 connected to a second side of the bending region BA. In the second direction DR2, a side of the second sub-region SB2 may be connected to the bending region BA, and on another side of the second sub-region SB2, signal pads SPD connected to the display circuit board 300 may be arranged.

According to an embodiment, one or more of the display driving circuit 200, the touch driving circuit 400, or the scan driving circuit 500 may be disposed in the second sub-region SB2 of the substrate 110. However, this is only an example, and the display device 100 of an embodiment is not limited to the illustration of FIG. 5. That is, one or more of the display driving circuit 200, the touch driving circuit 400, or the scan driving circuit 500 may be mounted on the display circuit board 300.

When the display driving circuit 200 is disposed on the display circuit board 300, the data pad lines DPDL (see FIG. 15) disposed in the second sub-region SB2 and electrically connecting between the display driving circuit 200 and the data lines DL (see FIG. 8) may extend from the bending region BA to the signal pads SPD arranged on a side of the second sub-region SB2.

When the scan driving circuit 500 is disposed on the display circuit board 300, the read-out pad lines ROPDL (see FIG. 15) disposed in the second sub-region SB2 and electrically connecting between the scan driving circuit 500 and the read-out lines ROL (see FIG. 8) may extend from the bending region BA to the signal pads SPD arranged on a side of the second sub-region SB2.

Referring to FIG. 6, the display area DA may include emission areas EA, a non-emission area NEA which is a separation area between the emission areas EA, and light sensing areas ODA disposed in parts of the non-emission area NEA. Each of the emission areas EA may be a unit that emits light in a wavelength band corresponding to a certain color with a luminance corresponding to an image signal. Different emission areas EA may emit light in different wavelength bands corresponding to different colors.

Each of the emission areas EA may have a rhombus planar shape or a rectangular planar shape. However, this is only an example, and the planar shape of the plurality of emission areas EA according to an embodiment is not limited to that illustrated in FIG. 6. That is, the plurality of emission areas EA may have a polygonal shape such as a rhombus shape or a hexagonal shape other than a rectangular shape, a circular shape, or an elliptical shape in plan view.

The emission areas EA may include a first emission area EA1 emitting light of a first color having a predetermined wavelength band, a second emission area EA2 emitting light of a second color having a wavelength band lower than that of the first color, and a third emission area EA3 emitting light of a third color having a wavelength band lower than that of the second color. For example, the first color may be red having a wavelength band of approximately 600 nm to approximately 750 nm, the second color may be green having a wavelength band of approximately 480 nm to approximately 560 nm, and the third color may be blue having a wavelength band of approximately 370 nm to approximately 460 nm. However, this is only an example, and the wavelength bands of the first color, the second color, and the third color according to an embodiment of this specification are not limited thereto.

Since the emission areas EA include the first emission area EA1, the second emission area EA2, and the third emission area EA3, each of unit pixels UPX may be provided by a combination of one or more first emission areas EA1, one or more second emission areas EA2, and one or more third emission areas EA3 adjacent to each other among the emission areas EA.

Each of the unit pixels UPX may be a unit for displaying various colors including white. That is, light of various colors displayed by the unit pixels UPX may be implemented as a mixture of light emitted from two or more emission areas EA included in each unit pixel UPX.

In a case where the first color of the first emission area EA1, the second color of the second emission area EA2, and the third color of the third emission area EA3 are red, green, and blue, respectively, the third emission area EA3 may have a larger width than the first emission area EA1, and the second emission area EA2 may have a smaller width than the first emission area EA1. However, this is merely an example, and the width of each of the emission areas EA is not limited to that illustrated in FIG. 6.

Further, the first emission area EA1 and the third emission area EA3 may be alternately arranged in the first direction DR1 or the second direction DR2. In addition, the second emission area EA2 may be arranged side by side in the first direction DR1 or the second direction DR2 and may be disposed between the first emission area EA1 and the third emission area EA3 in the first direction DR1.

In this case, each of the unit pixels UPX may include a first emission area EA1, a third emission area EA3, and two second emission areas EA2, which may be adjacent to each other. However, this is only an example, and the arrangement pattern of the emission areas EA and the components of the unit pixel UPX according to an embodiment are not limited to those illustrated in FIG. 6.

According to an embodiment, the display area DA may include the light sensing areas ODA disposed in parts of the non-emission area NEA. For example, the light sensing areas ODA may be disposed between the second emission areas EA2 having a relatively small width, in the second direction DR2. One or more emission areas EA may be disposed between the light sensing areas ODA in each of the first and second directions DR1 and DR2.

Figure 8:
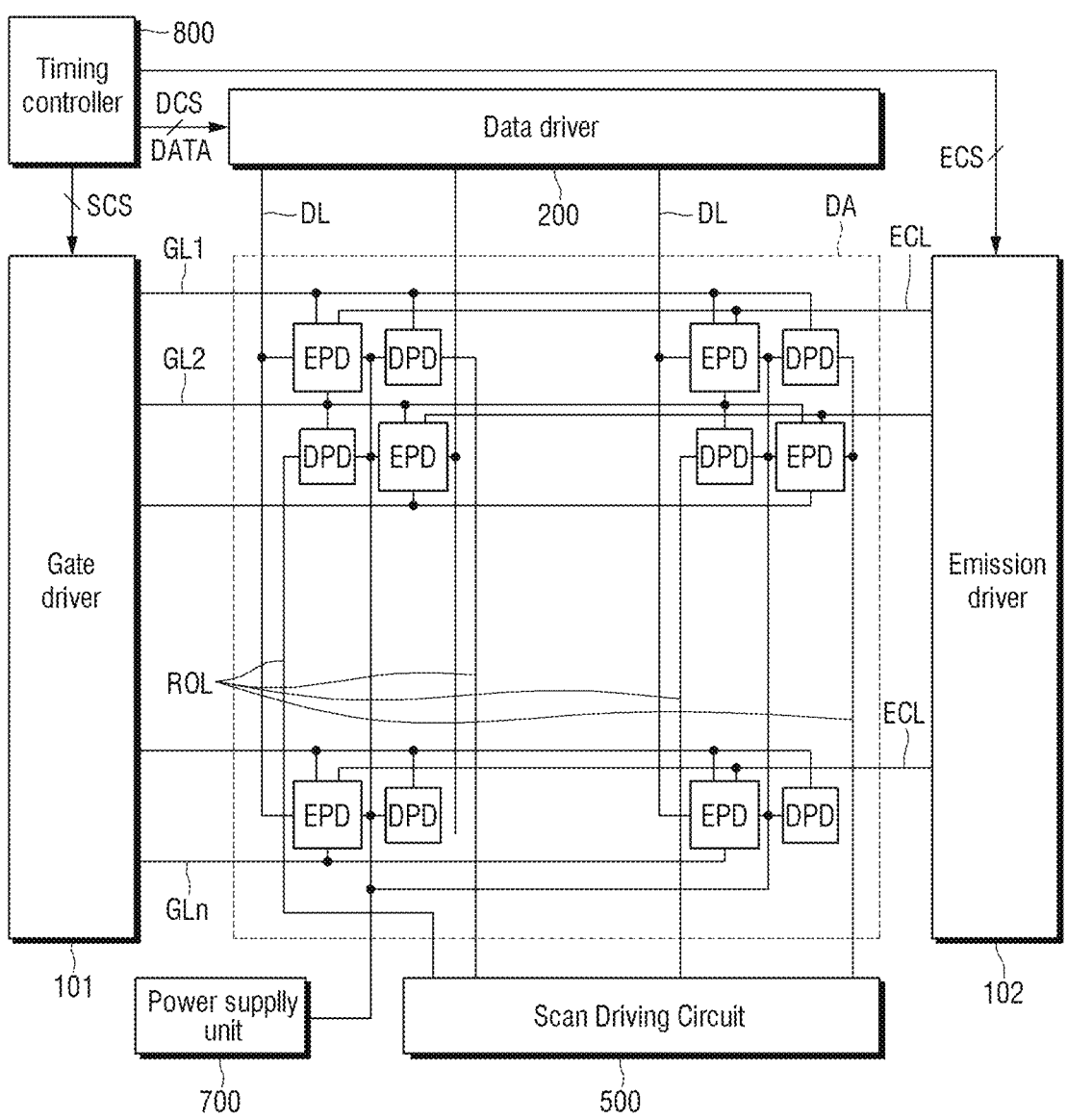
FIG. 8 is a block diagram showing a circuit layer of FIG. 4.

Referring again to FIG. 4, the circuit layer 120 on the substrate 110 may include light emitting pixel drivers EPD (see FIG. 8), the light sensing pixel drivers DPD (see FIG. 8), the data lines DL (see FIG. 8), and read-out lines ROL (see FIG. 8). The light emitting pixel drivers EPD may respectively correspond to the emission areas EA (see FIG. 6). The light sensing pixel drivers DPD (see FIG. 8) may respectively correspond to the light sensing areas ODA (see FIG. 6). The data lines DL (see FIG. 8) may be electrically connected to the light emitting pixel drivers EPD. The read-out lines ROL (see FIG. 8) may be electrically connected to the light sensing pixel drivers DPD.

The element layer 130 may include light emitting elements LE (see FIG. 9) and the light sensing elements PD. The light emitting elements LE (see FIG. 9) may respectively correspond to the emission areas EA. The light sensing elements PD (see FIG. 10) may respectively correspond to the light sensing areas ODA.

The encapsulation layer 140 may cover the element layer 130. The encapsulation layer 140 may extend into the non-display area NDA to be contact with the circuit layer 120. The encapsulation layer 140 may include a structure in which two or more inorganic layers and at least one organic layer are alternately stacked.

The touch sensor layer 150 may be disposed on the encapsulation layer 140 and may correspond to the main region MA. The touch sensor layer 150 may include touch electrodes for sensing a touch of a user or an object.

The polarization layer 160 blocks external light reflected from the touch sensor layer 150, the encapsulation layer 140, the element layer 130, and the circuit layer 120, and the interfaces thereof, and this is to prevent the deterioration of visibility of an image due to external light reflection.

The cover window 11 of the electronic device 10 may be disposed on the polarization layer 160. The cover window 11 may be attached to the polarization layer 160 by a transparent adhesive member such as an optically clear adhesive (OCA) film or an optically clear resin (OCR). The cover window 11 may be made of an inorganic material such as glass, or an organic material such as plastic or a polymer material.

The circuit layer 120 may be protected from electrical and physical impact on the display surface by the cover window 11, the touch sensor layer 150, the encapsulation layer 140, and the element layer 130.

The display device 100 according to an embodiment may include the light sensing elements PD disposed in the light sensing areas ODA, and may provide a scanning function to detect the shape of an object in contact with the screen.

Figure 7:
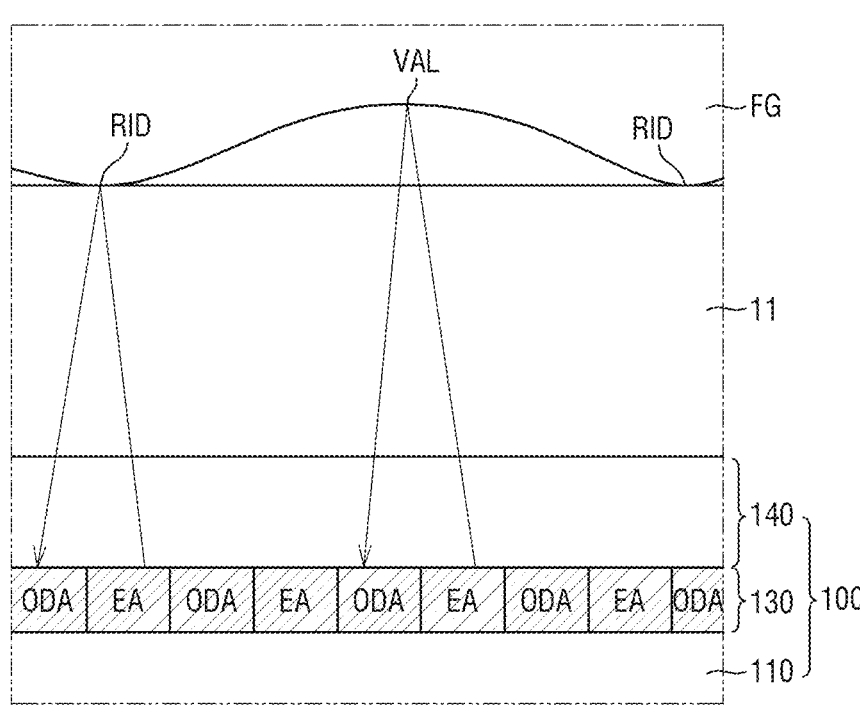
FIG. 7 is an diagram illustrating a scanning function by the light sensing areas shown in FIG. 6.
Figure 7:

FIG. 7 is an diagram illustrating a scanning function by the light sensing areas shown in FIG. 6.

Referring to FIG. 7, the fingerprint of a user's finger FG in contact with the cover window 11 includes ridges RID and valleys VAL between the ridges RID. The ridges RID in the fingerprint may be in contact with the cover window 11. The valleys VAL in the fingerprint may be spaced apart from the cover window 11. That is, the top surface of the cover window 11 facing the valleys VAL may be in contact with air.

Light emitted from the emission areas EA may be reflected by the user's finger FG in contact with the cover window 11 and detected by the light sensing elements PD of the light sensing areas ODA. Since the refractive index of the finger FG is different from that of the air, the amount of light reflected from the ridge RID may be different from the amount of light reflected from the valley VAL.

Accordingly, based on the difference in the amount of light incident on the light sensing elements PD, the ridge RID and the valley VAL of the fingerprint FG may be derived, so that the fingerprint FG pattern of the finger may be detected.

FIG. 8 is a block diagram showing a circuit layer of FIG. 4.

Referring to FIG. 8, the circuit layer 120 may include the light emitting pixel drivers EPD, the light sensing pixel drivers DPD, the data lines DL, and the read-out lines ROL. The light emitting pixel drivers EPD may respectively correspond to the emission areas EA of the display area DA. The light sensing pixel drivers DPD may respectively correspond to the light sensing areas ODA of the display area DA. The data lines DL may be disposed in the display area DA and electrically connected to the light emitting pixel drivers EPD. The read-out lines ROL may be disposed in the display area DA and electrically connected to the light sensing pixel drivers DPD.

The display device 100 according to an embodiment may include the display driving circuit 200 that outputs the data signal Vdata (see FIG. 9) of each of the light emitting pixel drivers EPD, the scan driving circuit 500 that collects light sensing signals of the light sensing pixel drivers DPD, a gate driving circuit 101 that supplies one or more gate signals to the light emitting pixel drivers EPD and the light sensing pixel drivers DPD, an emission control circuit 102 that supplies emission control signals EC (see FIG. 9) to the light emitting pixel drivers EPD, a power supply unit 700 that supplies various DC power voltages to the light emitting pixel drivers EPD and the light sensing pixel drivers DPD, and a timing controller 800 that controls a driving timing.

The timing controller 800 may receive an image signal supplied from the outside of the display device 100. The timing controller 800 may output image data DATA and a data control signal DCS to the display driving circuit 200. In addition, the timing controller 800 may generate a scan control signal SCS for controlling the operation timing of the gate driving circuit 101, and an emission control driving signal ECS for controlling the operation timing of the emission control circuit 102. For example, the timing controller 800 may generate the scan control signal SCS and the emission control driving signal ECS, output the scan control signal SCS to the gate driving circuit 101 through a scan control line, and output the emission control driving signal ECS to the emission control circuit 102 through an emission control driving line.

The display driving circuit 200 may convert the image data DATA into analog data voltages and output them to the data lines DL.

The gate driving circuit 101 may generate gate signals in response to the scan control signal SCS and sequentially output the gate signals to gate lines GL1 to GLn.

The power supply unit 700 may supply various types of DC powers to drive the light emitting pixel drivers EPD and the light sensing pixel drivers DPD. For example, the DC powers provided by the power supply unit 700 may include a first power ELVDD (see FIG. 9) and a second power ELVSS (see FIG. 9) for driving the light emitting elements LE, and a first initialization power VINT (see FIG. 9) for initializing the light emitting pixel drivers EPD.

In addition, the DC powers provided by the power supply unit 700 may further include a reset voltage Vrst (see FIG. 10) for reset, and a second initialization voltage VAINT (see FIG. 10) for initializing the light sensing pixel drivers DPD.

The emission control circuit 102 may sequentially output the emission control signals EC (see FIG. 9) to the emission control lines ECL in response to the emission control driving signal ECS. The emission control signals EC of the emission control circuit 102 may have pulses of a first level voltage or a second level voltage. The emission control circuit 102 may not be provided separately from the gate driving circuit 101 and may be incorporated into the gate driving circuit 101.

The scan driving circuit 500 may be electrically connected to the light sensing elements PD through the read-out lines ROL and the light sensing pixel drivers DPD.

Each of the light sensing elements PD may generate a photocurrent corresponding to the amount of light incident on the light sensing element PD, and the scan driving circuit 500 may detect the shape of a user's fingerprint based on the photocurrent of each of the light sensing elements PD.

The scan driving circuit 500 may generate scanning data depending on the magnitude of photocurrent detected by the light sensing elements PD and transmit it to the main processor 15, and the main processor 15 may compare the scanning data with reference data and execute an application based on whether the scanning data matches the user's fingerprint.

Figure 9:
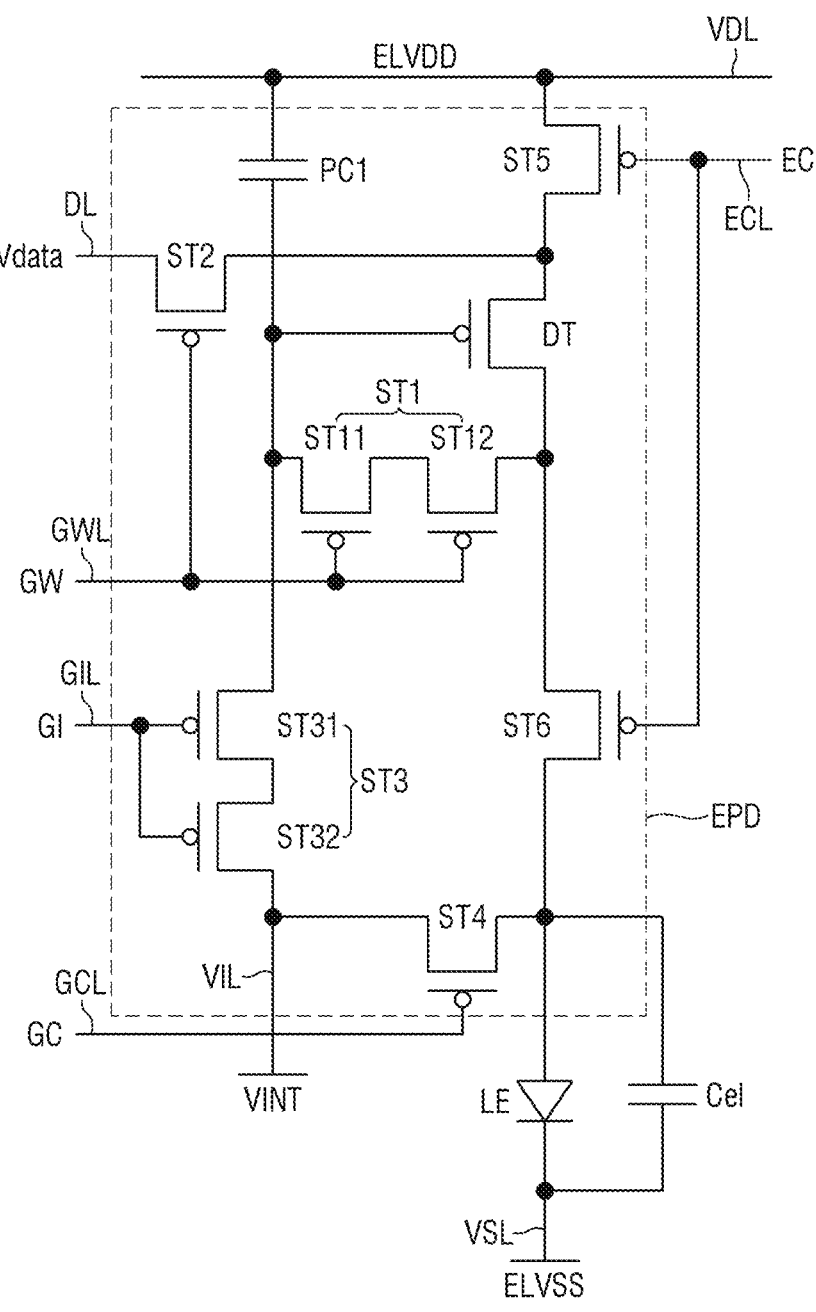
FIG. 9 is an equivalent circuit diagram of the light emitting pixel driver shown in FIG. 8.

FIG. 9 is an equivalent circuit diagram of the light emitting pixel driver shown in FIG. 8.

Referring to FIG. 9, the circuit layer 120 may include the light emitting pixel drivers EPD respectively corresponding to the emission areas EA, and a data line DL configured to transmit a data signal Vdata to the light emitting pixel drivers EPD. The light emitting pixel drivers EPD of the circuit layer 120 may be electrically connected to the light emitting elements LE of the element layer 130, respectively.

The circuit layer 120 may further include a first power line VDL that transmits a first power ELVDD to the light emitting pixel drivers EPD, and an initialization voltage line VIL that transmits a first initialization power VINT to the light emitting pixel drivers EPD. The circuit layer 120 may further include a scan write line GWL that transmits a scan write signal GW to the light emitting pixel drivers EPD, a scan initialization line GIL that transmits a scan initialization signal GI to the light emitting pixel drivers EPD, an emission control line ECL that transmits an emission control signal EM to the light emitting pixel drivers EPD, and a gate control line GCL that transmits a gate control signal GC to the light emitting pixel drivers EPD.

Referring to FIG. 9, a light emitting pixel driver EPD among the light emitting pixel drivers EPD of the circuit layer 120 may include a driving transistor DT generating a driving current to drive the light emitting element LE electrically connected to the one light emitting pixel driver EPD. In addition, a light emitting pixel driver EPD may further include two or more transistors ST1 to ST6 electrically connected to the driving transistor DT, and the at least one capacitor PC1.

An anode electrode 131 (see FIG. 13) of the light emitting element LE may be electrically connected to the light emitting pixel driver EPD, and a cathode electrode 134 (see FIG. 13) of the light emitting element LE may be electrically connected to a second power line VSL transmitting a second driving power ELVSS that has a voltage level lower than that of the first power ELVDD.

The light emitting element LE may be an organic light emitting diode having a light emitting layer made of an organic light emitting material. In an embodiment, the light emitting element LE may be an inorganic light emitting element including a light emitting layer made of an inorganic semiconductor. In an embodiment, the light emitting element LE may be a quantum dot light emitting element having a quantum dot light emitting layer. In an embodiment, the light emitting element LE may be a micro light emitting diode.

A capacitor Cel connected in parallel with the light emitting element LE refers to a parasitic capacitance between the anode electrode 131 and the cathode electrode 134.

The driving transistor DT may be connected in series to the light emitting element LE between the first power line VDL and the second power line VSL. That is, the first electrode (e.g., the source electrode) of the driving transistor DT may be electrically connected to the first power line VDL through the fifth transistor ST5. Further, the second electrode (e.g., the drain electrode) of the driving transistor DT may be electrically connected to the anode electrode 131 of the light emitting element LE through the sixth transistor ST6.

The first electrode of the driving transistor DT may be electrically connected to the data line DL through the second transistor ST2.

The gate electrode of the driving transistor DT may be electrically connected to the first power line VDL through the first capacitor PC1. That is, the first capacitor PC1 may be electrically connected between the gate electrode of the driving transistor DT and the first power line VDL. The potential of the gate electrode of the driving transistor DT may be maintained by the first power ELVDD of the first power line VDL.

When the data signal Vdata of the data line DL is transmitted to the first electrode of the driving transistor DT through the turned-on second transistor ST2, the voltage difference corresponding to the data signal Vdata and the first power ELVDD may be generated between the gate electrode of the driving transistor DT and the first electrode of the driving transistor DT. In this case, when the voltage difference between the gate electrode of the driving transistor DT and the first electrode of the driving transistor DT, that is, the gate-source voltage difference is greater than or equal to a threshold voltage, the driving transistor DT may be turned on.

When the fifth transistor ST5 and the sixth transistor ST6 are turned on, the driving transistor DT may be connected in series with the light emitting element LE between the first power line VDL and the second power line VSL. Accordingly, a drain-source current corresponding to the data signal Vdata may be generated by the turned-on driving transistor DT and may be supplied as a driving current of the light emitting element LE. Accordingly, the light emitting element LE may emit light having a luminance corresponding to the data signal Vdata.

The second transistor ST2 may be connected between the first electrode of the driving transistor DT and the data line DL. The first transistor ST1 may be connected between the gate electrode of the driving transistor DT and the second electrode of the driving transistor DT. The first transistor ST1 may include a plurality of sub-transistors connected in series. For example, the first transistor ST1 may include a first sub-transistor ST11 and a second sub-transistor ST12.

The first electrode of the first sub-transistor ST11 may be connected to the gate electrode of the driving transistor DT, the second electrode of the first sub-transistor ST11 may be connected to the first electrode of the second sub-transistor ST12, and the second electrode of the second sub-transistor ST12 may be connected to the second electrode of the driving transistor DT.

In this way, it may be possible to prevent the potential of the gate electrode of the driving transistor DT from changing due to the leakage current caused by the first transistor ST1 that is not turned on.

The gate electrode of each of the second transistor ST2, the first sub-transistor ST11, and the second sub-transistor ST12 may be connected to the scan write line GWL. When the scan write signal GW is transmitted through the scan write line GWL, the second transistor ST2, the first sub-transistor ST11, and the second sub-transistor ST12 may be turned on. In this case, the data signal Vdata may be transmitted to the first electrode of the driving transistor DT through the turned-on second transistor ST2.

Further, the gate electrode of the driving transistor DT and the second electrode of the driving transistor DT may have the same potential through the turned-on first sub-transistor ST11 and the turned-on second sub-transistor ST12. Accordingly, the driving transistor DT may be turned on.

The third transistor ST3 may be connected between the gate electrode of the driving transistor DT and an initialization voltage line VIL.

The third transistor ST3 may include a plurality of sub-transistors connected in series. For example, the third transistor ST3 may include a third sub-transistor ST31 and a fourth sub-transistor ST32.

The first electrode of the third sub-transistor ST31 may be connected to the gate electrode of the driving transistor DT, the second electrode of the third sub-transistor ST31 may be connected to the first electrode of the fourth sub-transistor ST32, and the second electrode of the fourth sub-transistor ST32 may be connected to the initialization voltage line VIL. In this way, it may be possible to prevent the potential of the gate electrode of the driving transistor DT from changing due to the leakage current caused by the third transistor ST3 that is not turned on.

The gate electrode of each of the third sub-transistor ST31 and the fourth sub-transistor ST32 may be connected to the scan initialization line GIL.

When the scan initialization signal GI is transmitted through the scan initialization line GIL, the third sub-transistor ST31 and the fourth sub-transistor ST32 may be turned on and, thus, the potential of the gate electrode of the driving transistor DT may be initialized to the first initialization power VINT of the initialization voltage line VIL.

The fourth transistor ST4 may be connected between the anode electrode of the light emitting element LE and the initialization voltage line VIL. The gate electrode of the fourth transistor ST4 may be connected to the gate control line GCL. Accordingly, when the gate control signal GC is transmitted through the gate control line GCL, the fourth transistor ST4 may be turned on.

In this case, the potential of the anode electrode of the light emitting element LE may be initialized to the first initialization power VINT of the initialization voltage line VIL through the turned-on fourth transistor ST4. Accordingly, it may be possible to prevent the light emitting element LE from being driven by the current remaining in the anode electrode.

The fifth transistor ST5 may be connected between the first electrode of the driving transistor DT and the first power line VDL. The sixth transistor ST6 may be connected between the second electrode of the driving transistor DT and the anode electrode of the light emitting element LE. The gate electrode of each of the fifth transistor ST5 and the sixth transistor ST6 may be connected to the emission control line ECL.

Accordingly, when the emission control signal EM is transmitted through the emission control line ECL, the fifth transistor ST5 and the sixth transistor ST6 are turned on and, thus, the drain-source current of the driving transistor DT may be supplied as the driving current of the light emitting element LE.

Although FIG. 9 illustrates a case in which the driving transistor DT and the first to sixth transistors ST1 to ST6 included in the light emitting pixel driver EPD are all N-type metal oxide semiconductor field effect transistors (MOSFET), it should be noted that the light emitting pixel driver EPD of an embodiment is not limited to that illustrated in FIG. 9. That is, at least one of the driving transistor DT and the first to sixth transistors ST1 to ST6 included in the light emitting pixel driver EPD according to an embodiment may be a P-type MOSFET.

Figure 10:
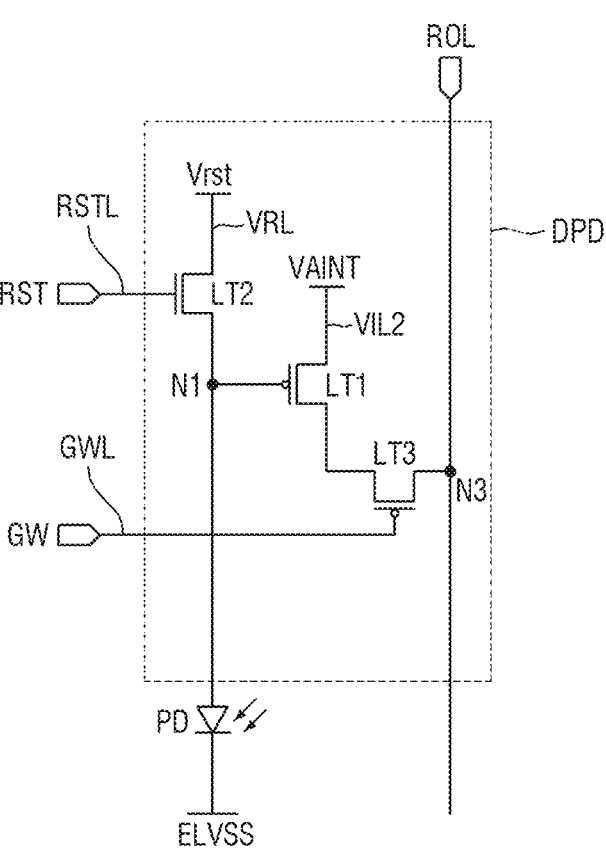
FIG. 10 is an equivalent circuit diagram of the light sensing pixel driver shown in FIG. 8.

FIG. 10 is an equivalent circuit diagram of the light sensing pixel driver shown in FIG. 8.

Referring to FIG. 10, the circuit layer 120 may further include a reset control line RSTL electrically connected to the light sensing pixel drivers DPD. Each of the light sensing pixel drivers DPD may include two or more sensing transistors LT1, LT2, and LT3, and may be electrically connected between each light sensing element PD and the scan driving circuit 500. For example, each of the light sensing pixel drivers DPD may include first to third sensing transistors LT1, LT2, and LT3.

The light sensing element PD may be a photoelectric conversion element that converts incident light into an electrical signal by generating a photocurrent corresponding to the amount of the incident light, and outputs a light sensing signal.

The light sensing element PD may be a photodiode including a sensing anode electrode, a sensing cathode electrode, and a photoelectric conversion layer disposed between the sensing anode electrode and the sensing cathode electrode.

The light sensing element PD may be a phototransistor or an inorganic photodiode formed of a PN type or PIN type inorganic material. According to an embodiment, the photoelectric conversion element PD may also be an organic photodiode including an electron donating material generating donor ions and an electron accepting material generating acceptor ions.

As photocharges generated in the photoelectric conversion layer move in response to incident light, a photocurrent may be generated between the sensing anode electrode and the sensing cathode electrode.

As one example, photocharges generated in the photoelectric conversion layer by light incident on the light sensing element PD may be accumulated in the sensing anode electrode. In this case, the voltage of a first node N1 electrically connected to the sensing anode electrode may increase. When the light sensing element PD and the readout line ROL are connected to the first node N1 by the turn-on of the first and third sensing transistors LT1 and LT3, a sensing voltage may be accumulated at a third node N3 between the read-out line ROL and the third sensing transistor LT3 in proportion to the voltage at the first node N1 where charges are accumulated.

The first sensing transistor LT1 may be turned on by the voltage of the first node N1 to connect a second initialization power line VIL2 to the second electrode of the third sensing transistor LT3. The first sensing transistor LT1 may be a source follower amplifier that generates a source-drain current in proportion to an amount of an electric charge(s) of the first node N1 inputted to the gate electrode thereof. The first electrode of the first sensing transistor LT1 is illustrated as being connected to the second initialization power line VIL2, but is not limited thereto and may be connected to the first power line VDL or the initialization voltage line VIL.

The second sensing transistor LT2 may be turned on by the reset control signal of the reset control line RSTL to connect the first node N1 to the reset voltage line VRL. Accordingly, the potential of the first node N1 may be reset.

The third sensing transistor LT3 may be turned on by the scan write signal GW of the scan write line GWL to connect the second electrode of the first sensing transistor LT1 and the read-out line ROL.

An active layer of each of the first to third sensing transistors LT1, LT2, and LT3 may include any one of polysilicon, amorphous silicon, or an oxide semiconductor. For example, the active layer of each of the first and third sensing transistors LT1 and LT3 may be made of polysilicon, and the active layer of the second sensing transistor LT2 may be made of an oxide semiconductor. In this case, the first sensing transistor LT1 and the third sensing transistor LT3 may be formed of a P-type MOSFET, and the second sensing transistor LT2 may be formed of an N-type MOSFET.

Figure 11:
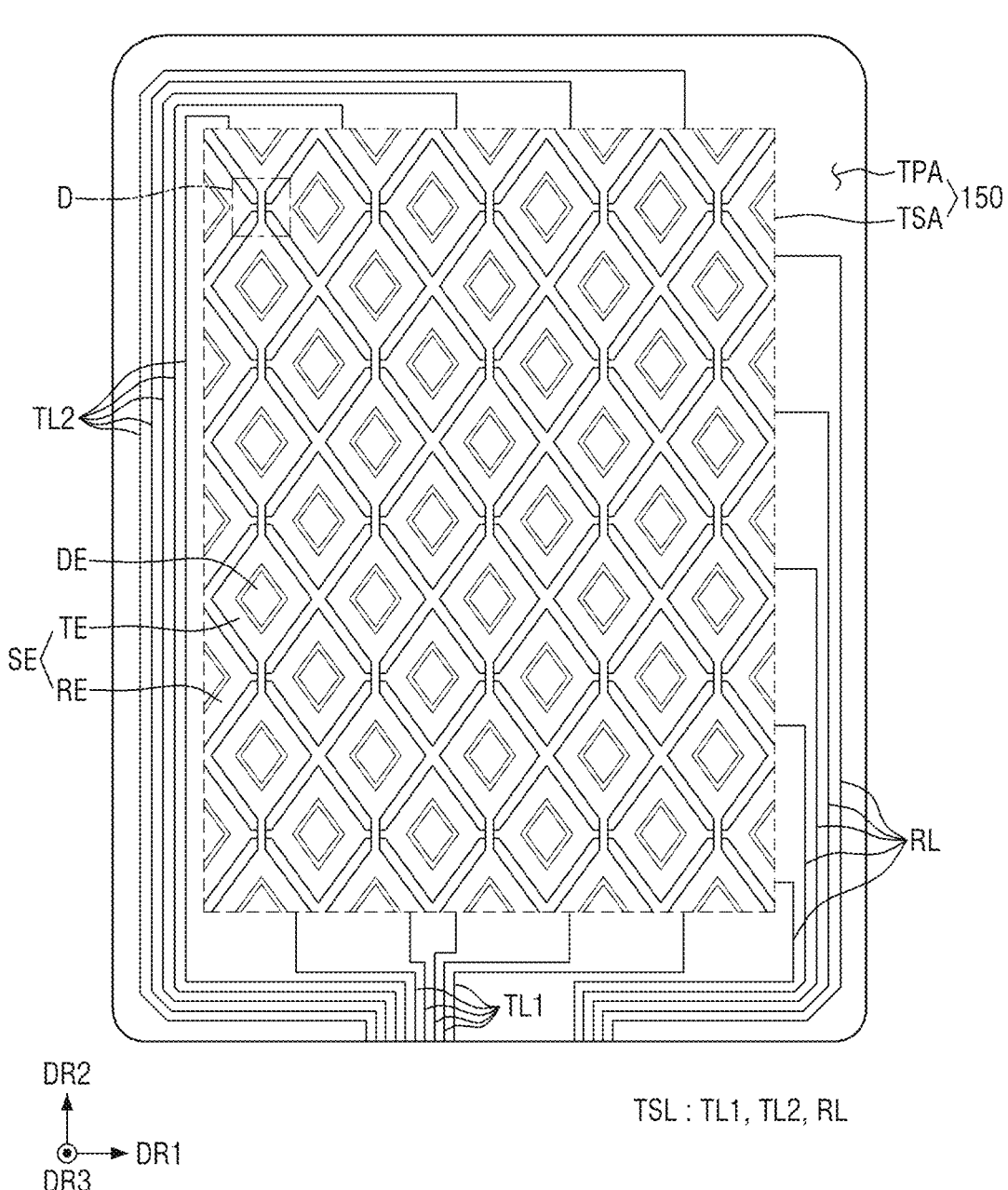
FIG. 11 is a plan view illustrating the touch sensor layer of FIG. 4.
Figure 12:
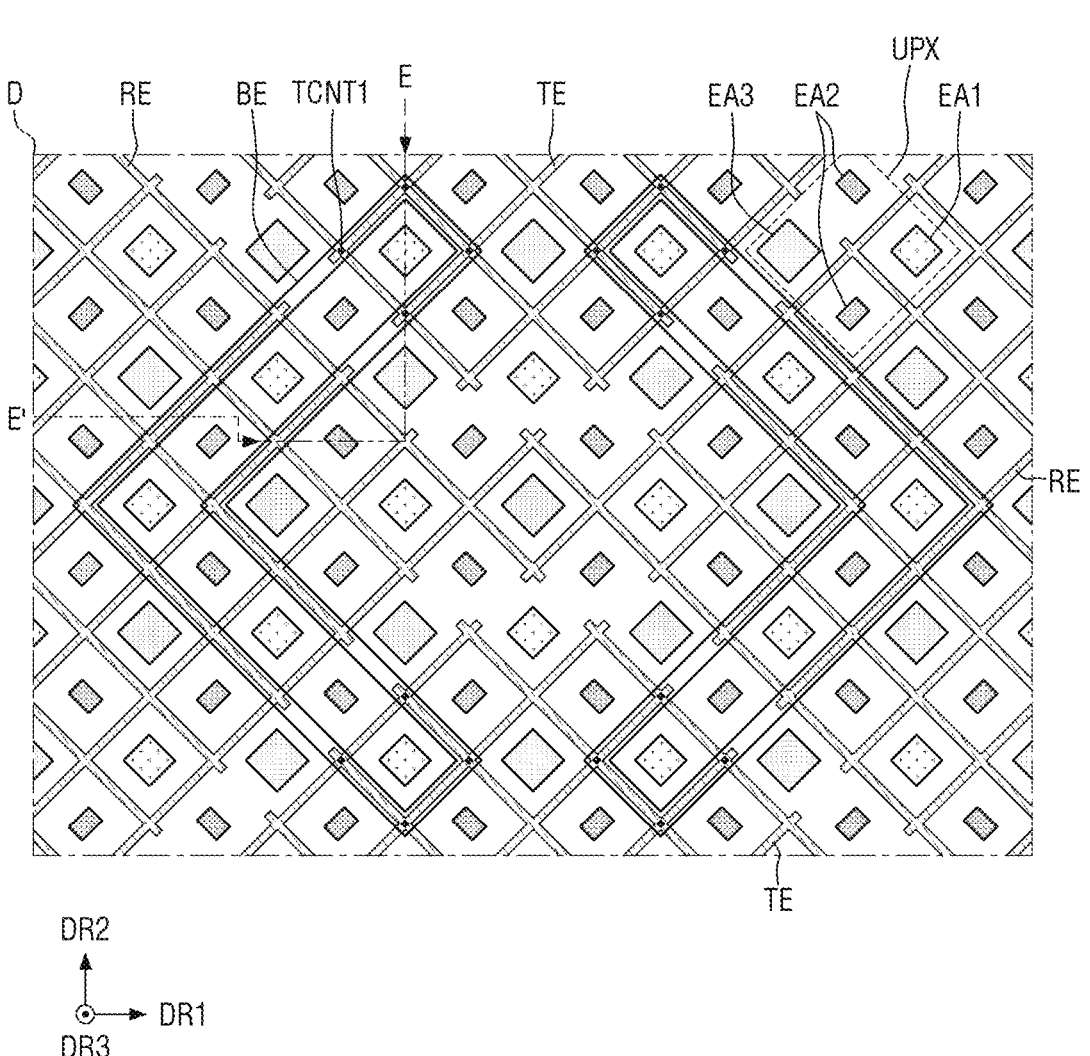
FIG. 12 is an enlarged view showing part D of FIG. 11.
Figure 13:
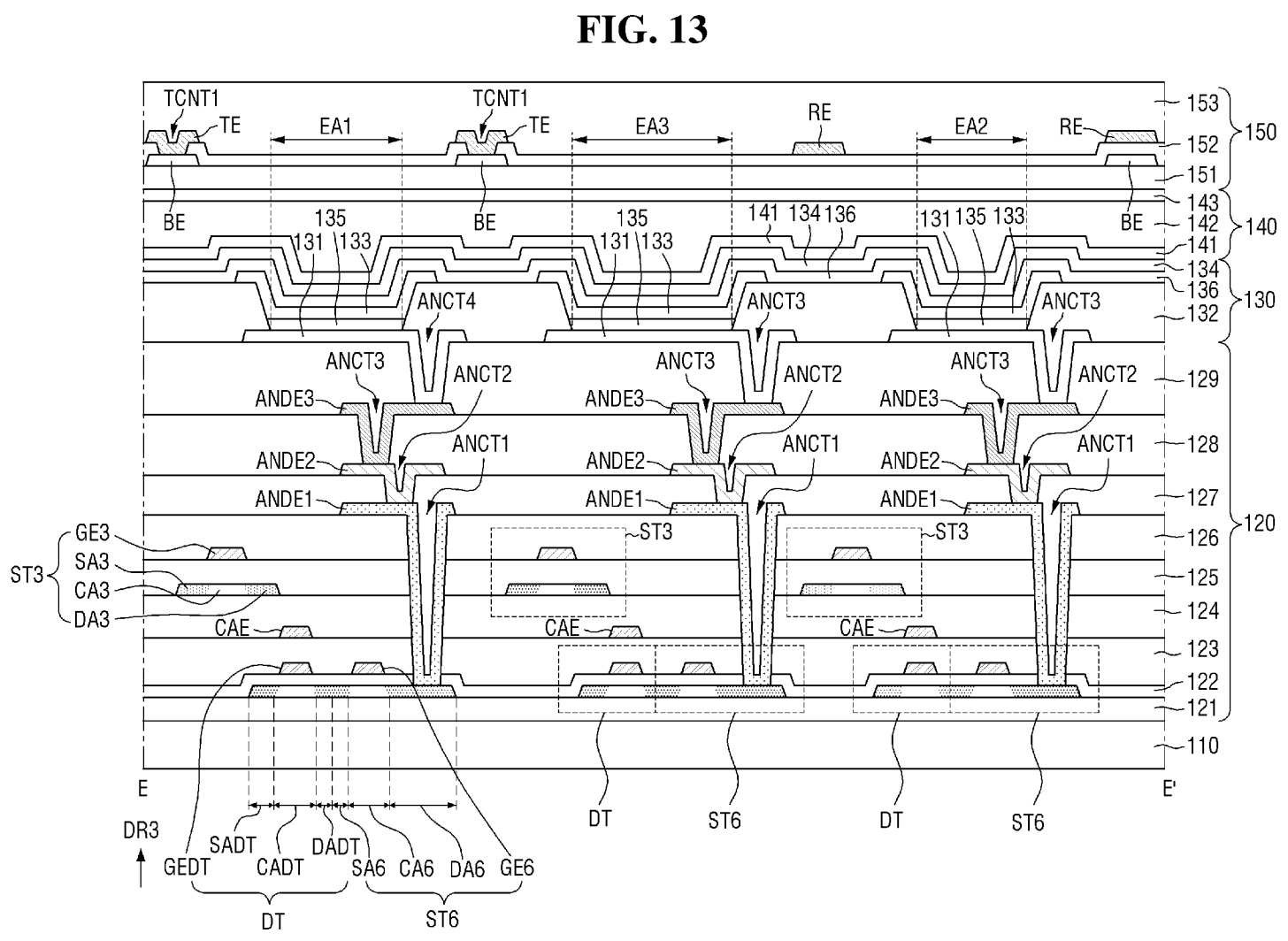

FIG. 11 is a plan view illustrating the touch sensor layer of FIG. 4. FIG. 12 is an enlarged view showing part D of FIG. 11. FIG. 13 is a cross-sectional view taken along line E-E' of FIG. 12.

FIG. 11 shows a capacitive touch sensor layer 150. In this case, the touch driving circuit 400 may sense a touch based on whether capacitance fluctuations. FIG. 11 is merely an example, and the touch sensor layer 150 according to an embodiment is not limited to that illustrated in FIG. 11. For example, FIG. 11 may illustrate only some of the components of the touch sensor layer 150 for simplicity of description.

Referring to FIG. 11, the touch sensor layer 150 may be disposed in the main region MA. The touch sensor layer 150 may include a touch sensing area TSA for sensing a user's touch and a touch periphery area TPA around the touch sensing area TSA.

The touch sensing area TSA may have a wider width than the display area DA and may be similar to the display area DA. Accordingly, the touch periphery area TPA, which is a periphery of the touch sensing area TSA, may be similar to the non-display area NDA, which is a periphery of the display area DA. For example, the touch sensing area TSA may overlap the display area DA and the edge of the non-display area NDA in contact with the display area DA. In this case, the touch periphery area TPA may overlap the remaining part of the non-display area NDA that does not correspond to the touch sensing area TSA.

The touch sensor layer 150 may include sensor electrodes SE and dummy electrodes DE that are matrix-arranged in the touch sensing area TSA and generate mutual capacitance, and touch sensor lines TSL disposed in the touch periphery area TPA.

The sensor electrodes SE may include a driving electrode TE (touch driving electrode) to which a driving signal is applied, and a sensing electrode RE (receiving electrode) to sense a voltage charged in mutual capacitance with the driving electrode TE.

The touch sensor lines TSL may include a first driving line TL1, a second driving line TL2, and a sensing line RL. Each of the first driving line TL1 and the second driving line TL2 may be electrically connected to two or more driving electrodes TE extending in the second direction DR2 among the driving electrodes TE. The first driving line TL1 may extend from a part of the touch periphery area TPA between a side of the touch sensing area TSA in the second direction DR2 and the sub-region SBA, to the sub-region SBA.

The second driving line TL2 may extend from a part of the touch periphery area TPA, which is in contact with the other side of the touch sensing area TSA in the second direction DR2, to the sub-region SBA through a portion of the touch periphery area TPA that is in contact with a side of the touch sensing area TSA in the first direction DR1.

The sensing line RL may be electrically connected to two or more sensing electrodes RE extending in the first direction DR1 among the sensing electrodes RE.

The sensing electrodes RE may be arranged in parallel in the first direction DR1. The sensing electrodes RE adjacent in the first direction DR1 may be electrically connected to each other through a protruding portion in the first direction DR1.

The driving electrodes TE may be arranged in parallel in the second direction DR2. The driving electrodes TE adjacent in the second direction DR2 may be electrically connected to each other through a bridge electrode BE (see FIG. 12) in the second direction DR2.

Each of the driving electrodes TE and the sensing electrodes RE may have a shape surrounding the dummy electrode DE disposed in the center thereof.

Each of the dummy electrodes DE may be spaced apart from the driving electrode TE or the sensing electrode RE that surrounds it. The dummy electrode DE may be maintained in a floating state.

Although FIG. 11 illustrates that each of the driving electrode TE, the sensing electrode RE, and the dummy electrode DE has a rhombic planar shape, embodiments are not limited to that illustrated in FIG. 11. For example, the planar shape of the driving electrode TE, the sensing electrode RE, and the dummy electrode DE may be a quadrilateral shape other than a rhombus, a polygonal shape other than a quadrilateral shape, a circular shape, or an elliptical shape.

The display device 100 according to an embodiment may include the signal pads (not shown) disposed in the second sub-region SB2 and connected to the display circuit board 300.

Referring to FIG. 12, the driving electrode TE and the sensing electrode RE may be formed of the same conductive layer and may be spaced apart from each other. The bridge electrode BE may be provided as a different conductive layer from the driving electrode TE and the sensing electrode RE.

Although FIG. 12 illustrates the bridge electrode BE having a shape including at least one bend, the shape of the bridge electrode BE according to an embodiment is not limited to that illustrated in FIG. 12.

The driving electrodes TE adjacent in the second direction DR2 may be electrically connected to each other through two or more bridge electrodes BE. In this way, reliability of the electrical connection between the driving electrodes TE may be improved.

Although FIG. 12 illustrates that two bridge electrodes BE parallel to each other are disposed between the driving electrodes TE adjacent to each other in the second direction DR2, an embodiment is not limited to that illustrated in FIG. 12.

The bridge electrode BE may be electrically connected to the driving electrodes TE through touch contact holes TCNT1.

The driving electrode TE, the sensing electrode RE, and the bridge electrode BE may have a mesh or net structure in plan view. The dummy electrodes DE may also have a mesh or net structure in plan view. In this way, since the overlapping width of the driving electrode TE, the sensing electrode RE, the dummy electrode DE, and the bridge electrode BE in the emission areas EA may be reduced, a decrease in light emission efficiency due to the driving electrode TE, the sensing electrode RE, the dummy electrode DE, and the bridge electrode BE may be reduced.

Although FIG. 12 illustrates that each of the emission areas EA has a rhombic or rectangular planar shape, the planar shape of the emission areas EA according to an embodiment is not limited to that illustrated in FIG. 12. That is, each of the emission areas EA may have a planar shape such as a polygonal shape other than a quadrilateral shape, a circular shape, or an elliptical shape. Different ones of the emissions areas EA may have different shapes and/or sizes. For example, the first emission area EA1 and the second emission area EA2 may have a square shape, and the third emission area EA3 may have a rectangular shape. In another example, the first emission area EA1 may have a relatively small square shape and the second emission area EA2 may have a relatively large square shape. The description of the emissions areas EA is only an example, and the shapes and/or sizes of the emissions areas EA according to an embodiment are not limited to the above description.

Referring to FIG. 13, the display device 100 according to an embodiment may include the substrate 110, the circuit layer 120 on the substrate 110, the element layer 130 on the circuit layer 120, the encapsulation layer 140 on the element layer 130, and the touch sensor layer 150 on the encapsulation layer 140.

The circuit layer 120 may include the light emitting pixel drivers EPD respectively corresponding to the emission areas EA, and the light sensing pixel drivers DPD respectively corresponding to the light sensing areas ODA. Each of the light emitting pixel drivers EPD may include the driving transistor DT and two or more transistors ST1 to ST6 electrically connected to the driving transistor DT (see FIG. 9). Each of the light sensing pixel drivers DPD may include two or more sensing transistors LT1, LT2, and LT3 (see FIG. 10).

According to an embodiment, the driving transistor DT, two or more transistors ST1 to ST6, and two or more sensing transistors LT1, LT2, and LT3 may each include a semiconductor layer having a channel region CA, a source region SA, and a drain region DA, and a gate electrode overlapping the channel region CA of the semiconductor layer.

The circuit layer 120 may include a buffer layer 121 disposed on the substrate 110, a first gate insulating layer 122, a second gate insulating layer 123, a first interlayer insulating layer 124, a third gate insulating layer 125, a second interlayer insulating layer 126, a first planarization layer 127, a second planarization layer 128, and a third planarization layer 129. The buffer layer 121, the first gate insulating layer 122, the second gate insulating layer 123, the first interlayer insulating layer 124, the third gate insulating layer 125, the second interlayer insulating layer 126, the first planarization layer 127, the second planarization layer 128, and the third planarization layer 129 may be sequentially stacked.

A channel region CADT, a source region SADT, a drain region DADT, a source region SA6, a channel region CA6, and a drain region DA6 may be formed on the buffer layer 121. Hereinafter, the channel region CADT, the source region SADT, the drain region DADT, the source region SA6, the channel region CA6, and the drain region DA6 may be referred to as a first semiconductor layer. The first gate insulating layer 122 may be formed on the buffer layer 121, the channel region CADT, the source region SADT, and the drain region DADT, the source region SA6, the channel region CA6, and the drain region DA6. A gate electrode GEDT and a gate electrode GE6 may be formed of a first gate conductive layer on the first gate insulating layer 122. The second gate insulating layer 123 may be formed on the first gate insulating layer 122. A capacitor electrode CAE may be formed of a second gate conductive layer on the second gate insulating layer 123. The first interlayer insulating layer 124 may be formed on the capacitor electrode CAE and the second gate insulating layer 123. A source region SA3, a channel region CA3, and a drain region DA3 may be formed on the first interlayer insulating layer 124. Hereinafter, the source region SA3, the channel region CA3, and the drain region DA3 may be referred to as a second semiconductor layer. The third gate insulating layer 125 may be formed on the source region SA3, the channel region CA3, the drain region DA3, and the first interlayer insulating layer 124. A gate electrode GE3 may be formed of a third gate conductive layer on the third gate insulating layer 125. The second interlayer insulating layer 126 may be formed on the gate electrode GE3 and the third gate insulating layer 125. A first anode connection electrode ANDE1 may be formed on the second interlayer insulating layer 126. The first planarization layer 127 may be formed on the first anode connection electrode ANDE1 and the second interlayer insulating layer 126. A second anode connection electrode ANDE2 may be formed on the first planarization layer 127. The second planarization layer 128 may be formed on the second anode connection electrode ANDE2 and the first planarization layer 127. A third anode connection electrode ANDE3 may be formed on the second planarization layer 128. The third planarization layer 129 may be formed on the third anode connection electrode ANDE3 and the second planarization layer 128.

In one example, some (e.g., the driving transistor DT) of the driving transistor DT, two or more transistors ST1 to ST6, and two or more sensing transistors LT1, LT2, and LT3 may each include the channel region CADT, the source region SADT, and the drain region DADT formed of the first semiconductor layer on the buffer layer 121, and the gate electrode GEDT on the first gate insulating layer 122.

In addition, some others (e.g., the third transistor ST3) of the driving transistor DT, two or more transistors ST1 to ST6, and two or more sensing transistors LT1, LT2, and LT3 may each be provided as an N-type MOSFET including the channel region CA3, the source region SA3, and the drain region DA3 formed of the second semiconductor layer on the first interlayer insulating layer 124, and the gate electrode GE3 on the third gate insulating layer 125.

For example, among the driving transistor DT, two or more transistors ST1 to ST6, and two or more sensing transistors LT1, LT2, and LT3, the first transistor ST1 and the third transistor ST3 of the light emitting pixel driver EPD and the second sensing transistor LT2 of the light sensing pixel driver DPD may each be provided as a P-type MOSFET including the second semiconductor layer.

The buffer layer 121 may be used to block oxygen or moisture that has passed through the substrate 110, and may include an inorganic insulating material. Additionally, the buffer layer 121 may cover a light blocking layer (not shown) disposed on the substrate 110 and may reduce leakage current of the first semiconductor layer caused by light. The buffer layer 121 may be formed of multiple layers in which one or more inorganic layers of a silicon nitride layer, a silicon oxynitride layer, a silicon oxide layer, a titanium oxide layer and an aluminum oxide layer are alternately stacked.

Each of the buffer layer 121, the first gate insulating layer 122, the second gate insulating layer 123, and the first interlayer insulating layer 124 may be formed of at least one inorganic layer. For example, each of the buffer layer 121, the first gate insulating layer 122, the second gate insulating layer 123, and the first interlayer insulating layer 124 may be formed of multiple layers in which one or more inorganic layers of a silicon nitride layer, a silicon oxynitride layer, a silicon oxide layer, a titanium oxide layer, and an aluminum oxide layer are alternately stacked.

Each of the first planarization layer 127 and the second planarization layer 128 may be formed of an organic layer such as acryl resin, epoxy resin, phenolic resin, polyamide resin, polyimide resin or the like.

Each of the first semiconductor layer and the second semiconductor layer may include one of the semiconductor materials of poly-silicon, amorphous silicon, and oxide semiconductor. For example, the first semiconductor layer may include a silicon semiconductor material, and the second semiconductor layer may include an oxide semiconductor material.

In each of the driving transistor DT, two or more transistors ST1 to ST6, and two or more sensing transistors LT1, LT2, and LT3, the source region SA and the drain region DA may be connected to both sides of the channel region CA, respectively. The source region SA and the drain region DA may have higher conductivity than that of the channel region CA.

In each of the driving transistor DT, two or more transistors ST1 to ST6, and two or more sensing transistors LT1, LT2, and LT3, the gate electrode GE may overlap the channel region CA.

The first capacitor PC1 of the light emitting pixel drivers EPD may be provided as an overlapping area between a gate electrode GEDT of the driving transistor DT and a capacitor electrode CAE. The capacitor electrode CAE may be formed of the second gate conductive layer on a second gate insulating layer 123 covering the first gate conductive layer.

The anode electrode 131 of the element layer 130 may be electrically connected to the drain region DA6 of the sixth transistor ST6 through a first anode connection electrode ANDE1, a second anode connection electrode ANDE2, and a third anode connection electrode ANDE3.

The first anode connection electrode ANDE1 may be formed of the first source/drain conductive layer on the second interlayer insulating layer 126. The first anode connection electrode ANDE1 may be electrically connected to the drain region DA6 of the sixth transistor ST6 through a first anode contact hole ANCT1 penetrating the second interlayer insulating layer 126, the third gate insulating layer 125, the first interlayer insulating layer 124, the second gate insulating layer 123, and the first gate insulating layer 122.

The second anode connection electrode ANDE2 may be formed of the second source/drain conductive layer on the first planarization layer 127. The second anode connection electrode ANDE2 may be electrically connected to the first anode connection electrode ANDE1 through a second anode contact hole ANCT2 penetrating the first planarization layer 127.

The third anode connection electrode ANDE3 may be formed of a third source/drain conductive layer on the second planarization layer 128. The third anode connection electrode ANDE3 may be electrically connected to the second anode connection electrode ANDE2 through a third anode contact hole ANCH3 penetrating the second planarization layer 128.

The anode electrode 131 of the light emitting element LE may be disposed on the third planarization layer 129 that covers the third anode connection electrode ANDE3. The anode electrode 131 may be electrically connected to the third anode connection electrode ANDE3 through a fourth anode contact hole ANCT4 penetrating the third planarization layer 129.

The second source/drain conductive layer on the first planarization layer 127 may further include the data lines DL (see FIG. 8) that transmit the data signals Vdata to the light emitting pixel drivers EPD.

The third source/drain conductive layer on the second planarization layer 128 may include the read-out lines ROL (see FIG. 8) that output the light sensing signals of the light sensing pixel drivers DPD.

Each of the first gate conductive layer, the second gate conductive layer, the third gate conductive layer, the first source/drain conductive layer, the second source/drain conductive layer, and the third source/drain conductive layer may be formed as a multilayer containing two or more of molybdenum (Mo), aluminum (Al), chromium (Cr), gold (Au), titanium (Ti), nickel (Ni), neodymium (Nd), and copper (Cu). For example, each of the first gate conductive layer, the second gate conductive layer, and the third gate conductive layer may be formed as a single layer containing molybdenum (Mo), aluminum (Al), copper (Cu), or the like. Further, each of the first source/drain conductive layer, the second source/drain conductive layer, and the third source/drain conductive layer may be formed as a triple layer of Ti/Al/Ti.

The element layer 130 may include the light emitting elements LE respectively corresponding to the emission areas EA, and the light sensing elements PD respectively corresponding to the light sensing areas ODA.

Each of the light emitting elements LE and the light sensing elements PD may have a structure in which a photoelectric conversion material is interposed between the anode and cathode electrodes facing each other. For example, each of the light emitting elements LE may include the anode electrode 131 and the cathode electrode 134 facing each other, and a light emitting layer 133 disposed therebetween.

According to an embodiment, each of the light emitting elements LE may further include a first common layer 135 disposed between the anode electrode 131 and the light emitting layer 133, and a second common layer 137 disposed between the light emitting layer 133 and the cathode electrode 134. That is, the element layer 130 may include the anode electrodes 131 respectively corresponding to the emission areas EA, a pixel defining layer 132 corresponding to the non-emission area NEA and covering the edge of the anode electrode 131, the first common layers 135 respectively disposed on the anode electrodes 131, the light emitting layers 133 respectively disposed on the first common layers 135, the second common layer 136 corresponding to the emission areas EA and disposed on the light emitting layers 133 and the pixel defining layer 132, and the cathode electrode 134 disposed on the second common layer 136.

The anode electrode 131 may be disposed in each of the emission areas EA and may be electrically connected to one light emitting pixel driver EPD of the circuit layer 120. This anode electrode 131 may be referred to as a pixel electrode.

The anode electrode 131 may be formed of a metal material, having high reflectivity, such as a stacked structure (Ti/Al/Ti) of aluminum (Al) and titanium (Ti), a stacked structure (ITO/Al/ITO) of Al and indium tin oxide (ITO), an APC alloy, a stacked structure (ITO/APC/ITO) of an APC alloy and ITO, or the like. The APC alloy is an alloy of silver (Ag), palladium (Pd) and copper (Cu).

The first common layer 135 on the anode electrode 131 may be disposed in each of the emission areas EA. The first common layer 135 may include a hole transport layer. Alternatively, the first common layer 135 may further include a hole injection layer between the anode electrode 131 and the hole transport layer.

The light emitting layer 133 on the first common layer 135 may be disposed in each of the emission areas EA. The light emitting layer 133 of the first emission area EA1, the light emitting layer 133 of the second emission area EA2, and the light emitting layer 133 of the third emission area EA3 may include organic light emitting materials having different materials or contents. For example, the light emitting layer 133 may be formed of an organic light emitting material that converts electron-hole pairs into light. The organic light emitting material may include a host material and a dopant. The dopant may include a phosphorescent material or a fluorescent material.

The light emitting layer 133 of the first emission area EA1 emitting the first color may include a host material including carbazole biphenyl (CBP) or 1,3-bis (carbazol-9-yl) (mCP).

Further, the dopant of the light emitting layer 133 of the first emission area EA1 may be selected as any one or more phosphorescent materials selected among bis(1-phenyliso-quinoline) acetylacetonate iridium (PIQIr(acac)), bis(1-phe-nylquinoline) acetylacetonate iridium (PQIr(acac)), tris(1-phenylquinoline) iridium (PQIr), and octaethylporphyrin platinum (PtOEP), or a florescent material including PBD: Eu(DBM)3(Phen) or perylene.

The light emitting layer 133 of the second emission area EA2 emitting the second color having a wavelength band lower than that of the first color may include a host material including CBP or mCP. Further, a phosphorescent material including fac tris(2-phenylpyridinc) iridium (Ir(ppy)3), or a fluorescent material including tris(8-hydroxyquinolino)alu-minum (Alq3) may be selected as the dopant of the light emitting layer 133 of the second emission area EA2.

The light emitting layer 133 of the third emission area EA3 emitting the third color having a wavelength band lower than that of the second color may include a host material including CBP or mCP. A phosphorescent material including (4,6-F2ppy)2Irpic or L2BD111 may be selected as the dopant of the light emitting layer 133 of the third emission area EA3.

The description of the organic light emitting material of the light emitting layer 133 is only an example, and the material of the light emitting layer 133 according to an embodiment is not limited to the above description.

The second common layer 136 under the cathode electrode 134 may be disposed in the display area DA including the emission areas EA. The second common layer 136 under the cathode electrode 134 may be entirely disposed in the display area DA including the emission areas EA. The second common layer 136 may include an electron transport layer. In an embodiment, the second common layer 136 may further include an electron injection layer between the cathode electrode 134 and the electron transport layer.

The cathode electrode 134 may be entirely disposed in the display area DA including the emission areas EA and may be electrically connected to the second power line VSL (see FIG. 5). The cathode electrode 134 may be referred to as a common electrode.

The cathode electrode 134 may include a transparent conductive material (TCO) such as ITO or IZO that can transmit light or a semi-transmissive conductive material such as magnesium (Mg), silver (Ag), or an alloy of Mg and Ag. When the cathode electrode 138 is made of a semi-transmissive conductive material, an improvement in light output efficiency due to a micro cavity effect may be expected.

Meanwhile, although not separately shown, the light sensing elements PD of the element layer 130 have a structure substantially similar to the light emitting elements LE, except that they include the photoelectric conversion layer instead of the light emitting layer 133, and thus redundant description may be omitted below.

The encapsulation layer 140 may be disposed on the circuit layer 120 and cover the element layer 130.

The encapsulation layer 140 may include a first encapsulation layer 141 disposed on the element layer 130, a second encapsulation layer 142 disposed on the first encapsulation layer 141, overlapping the element layer 130, and a third encapsulation layer 143 disposed on the first encapsulation layer 141, covering the second encapsulation layer 142. The first encapsulation layer 141 may be made of an inorganic insulating material. The second encapsulation layer 142 may be made of an organic insulating material. The third encapsulation layer 143 may be made of an inorganic insulating material.

The second encapsulation layer 142 may be formed of an organic insulating material such as acryl resin, epoxy resin, phenolic resin, polyamide resin, polyimide resin or the like.

The second encapsulation layer 142 may be prepared by a process in which an organic material in a liquid state is dropped onto the first encapsulation layer 141, is widely diffused to cover the display area DA, and then is cured.

Accordingly, the display device 100 according to an embodiment may further include a dam (not shown) to limit the diffusion range of the organic material of the second encapsulation layer 142.

One or more dams may be disposed in the non-display area NDA in a form that surrounds the perimeter of the display area DA.

Since the second encapsulation layer 142 is diffused to the dam, the third encapsulation layer 143 may be in contact with the first encapsulation layer 141 between the dam and the edge of the substrate 110 in the non-display area NDA. Accordingly, an encapsulation structure formed by adhesion of inorganic materials may be provided.

Each of the first encapsulation layer 141 and the third encapsulation layer 143 may have a structure in which one or more inorganic layers of a silicon nitride layer, a silicon oxynitride layer, a silicon oxide layer, a titanium oxide layer, and an aluminum oxide layer are stacked.

The touch sensor layer 150 may include a buffer planarizing layer 151 disposed on the encapsulation layer 140, the bridge electrode BE disposed on the buffer planarizing layer 151, a sensor insulating layer 152 covering the bridge electrode BE, the driving electrode TE and the sensing electrode RE disposed on the sensor insulating layer 152, and an overcoat layer 153 covering the driving electrode TE and the sensing electrode RE.

Each of the buffer planarizing layer 151 and the sensor insulating layer 152 may have a structure in which one or more inorganic layers of a silicon nitride layer, a silicon oxynitride layer, a silicon oxide layer, a titanium oxide layer, and an aluminum oxide layer are stacked.

The overcoat layer 153 may be made of an organic material that can be disposed in a low-temperature process. For example, the overcoat layer 153 may be made of a negative photoresist material.

Each of the bridge electrode BE, the driving electrode TE, and the sensing electrode RE may be formed as a single layer or multiple layers made of any one of molybdenum (Mo), aluminum (Al), chromium (Cr), gold (Au), titanium (Ti), nickel (Ni), neodymium (Nd), or copper (Cu), or an alloy thereof.

Each of the dummy electrode DE disposed inside each of the driving electrode TE and the sensing electrode RE, the first driving line TL1 and the second driving line TL2 connected to the driving electrode TE, and the sensing line RL connected to the sensing electrode RE may be disposed on the same layer as the driving electrode TE and the sensing electrode RE.

The driving electrode TE may be electrically connected to the bridge electrode BE through the touch contact hole TCNT1 penetrating the sensor insulating layer 152.

The driving electrode TE, the sensing electrode RE, the dummy electrode DE, the first driving line TL1 and the second driving line TL2, and the sensing line RL may have a structure including a low reflective layer. In this way, the amount of light that is incident from the outside, reflected within the display device 100, and emitted (i.e., the reflection of external light) may be reduced.

The second sub-region SB2 of the sub-region SBA according to some embodiments will be described.

Figure 14:
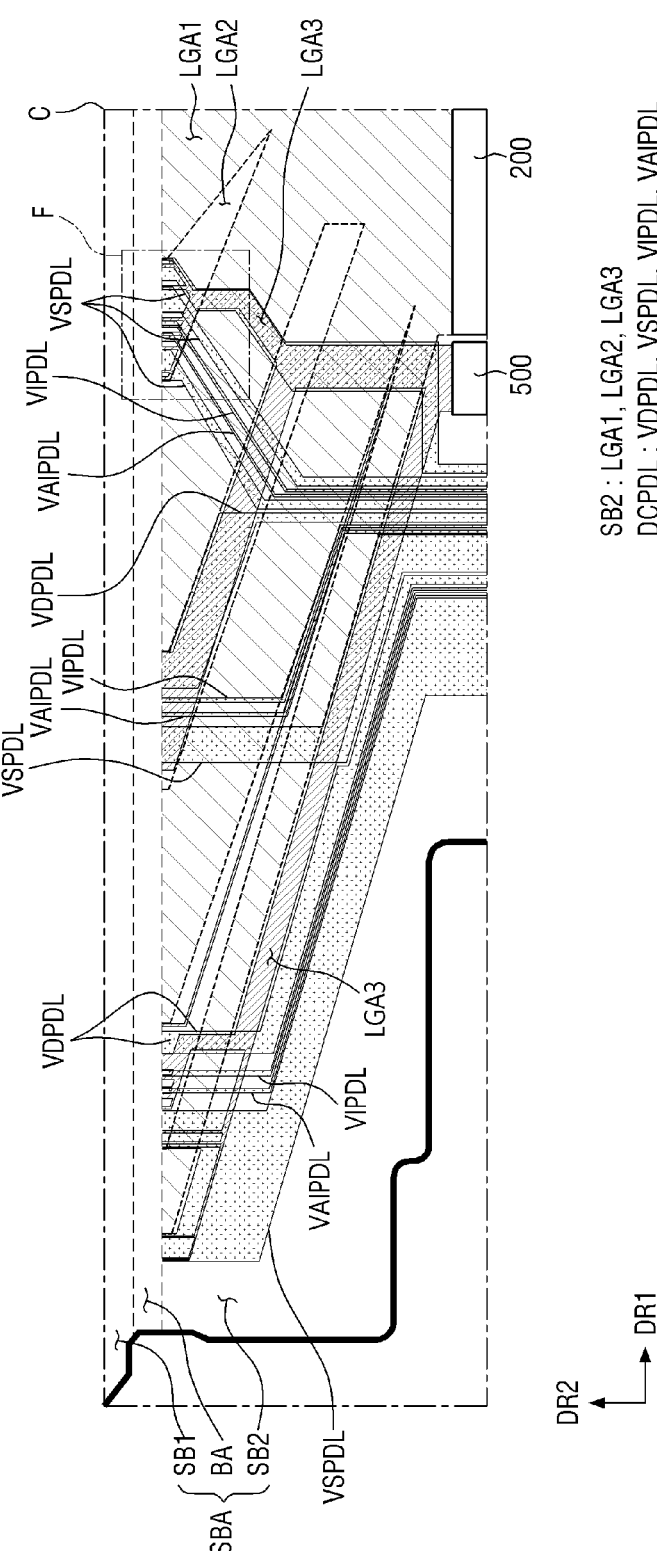
FIG. 14 is a plan view showing part C of FIG. 5 according to an embodiment.
Figure 16:
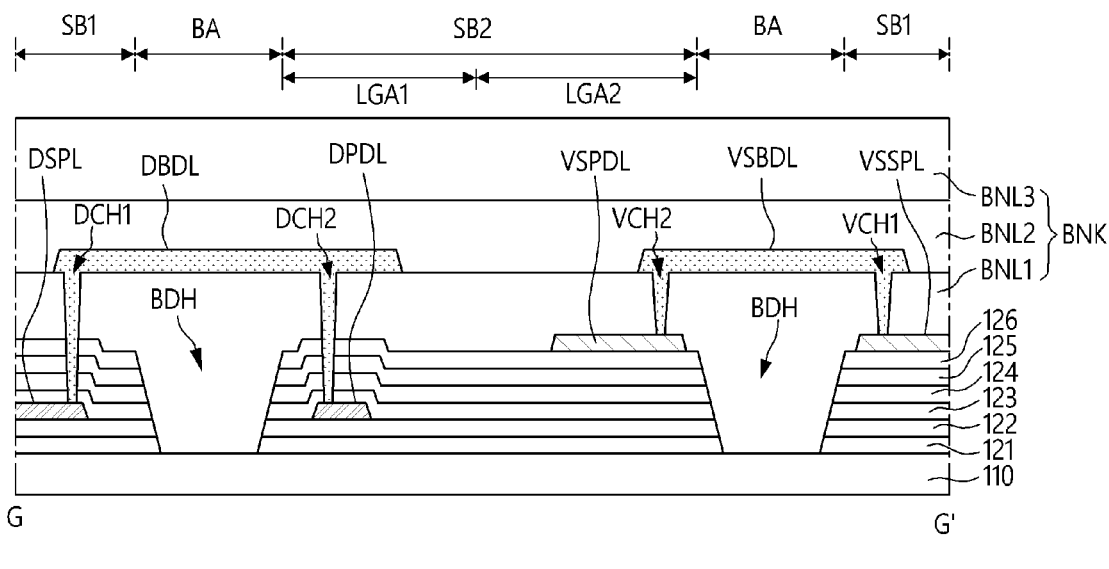
FIG. 16 is a cross-sectional view taken along line G-G' of FIG. 15.
Figure 17:
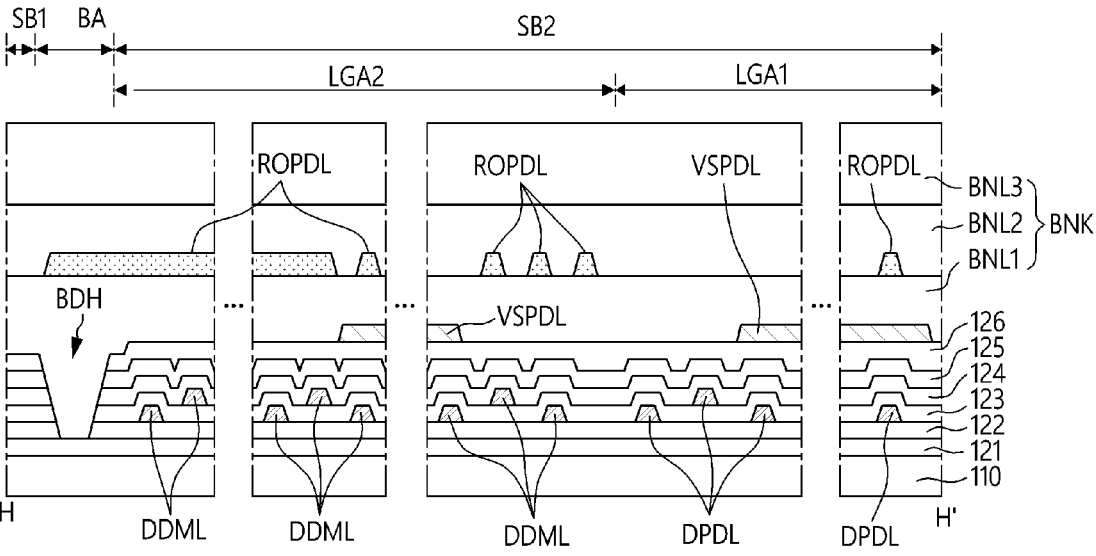
FIG. 17 is a cross-sectional view taken along line H-H' of FIG. 15.

FIG. 14 is a plan view showing part C of FIG. 5 according to an embodiment. FIG. 15 is an enlarged view showing part F of FIG. 14. FIG. 16 is a cross-sectional view taken along line G-G' of FIG. 15. FIG. 17 is a cross-sectional view taken along line H-H' of FIG. 15.

As mentioned above, the display device 100 according to an embodiment includes the substrate 110, the circuit layer 120, the element layer 130, the encapsulation layer 140, and the touch sensor layer 150.

The substrate 110 includes the main region MA and the sub-region SBA protruding from a side thereof. The main region MA includes the display area DA disposed in most of the main region MA, and the non-display area NDA disposed around the display area DA. The display area DA includes the emission areas EA that are mutually arranged, the non-emission area NEA that is a separation area between the emission areas EA, and the light sensing areas ODA disposed in parts of the non-emission area NEA.

The element layer 130 includes the light emitting elements LE respectively disposed in the emission areas EA, and the light sensing elements PD respectively disposed in the light sensing areas ODA.

The circuit layer 120 of the display device 100 according to an embodiment includes the light emitting pixel drivers EPD respectively electrically connected to the light emitting elements LE of the element layer 130, the light sensing pixel drivers DPD respectively electrically connected to the light sensing elements PD of the element layer 130, the data lines DL disposed in the display area DA and electrically connected to the light emitting pixel drivers EPD, and the read-out lines ROL disposed in the display area DA and electrically connected to the light sensing pixel drivers DPD.

Referring to FIG. 14, the sub-region SBA includes a bending region BA that is transformed into a bent shape, a first sub-region SB1 disposed between the main region MA and a side of the bending region BA, and a second sub-region SB2 connected to the other side of the bending region BA.

The display driving circuit 200 and the scan driving circuit 500 may be disposed in the second sub-region SB2.

The second sub-region SB2 may include a first line group region LGA1, a second line group region LGA2, and a third line group region LGA3. The first line group region LGA1 may extend from the bending region BA to the display driving circuit 200. The second line group region LGA2 may be surrounded by the bending region BA and the first line group region LGA1 and spaced apart from each other. The second line group region LGA2 may be disposed in the second sub-region SB2 and spaced apart from the display driving circuit 200, wherein the second line group region LGA2 is a dummy region. The third line group region LGA3 may extend from the bending region BA to the touch driving circuit 400.

According to an embodiment, at least a portion of the third line group region LGA3 may overlap with the second line group regions LGA2.

Referring to FIGS. 4 and 15, the circuit layer 120 (shown in FIG. 4) according to an embodiment includes data pad lines DPDL disposed in the second sub-region SB2 of the sub-region SBA and electrically connecting the data lines DL and the display driving circuit 200, data dummy lines DDML disposed in the second sub-region SB2, extending in the bending region BA and spaced apart from the display driving circuit 200; and read-out pad lines ROPDL disposed in the second sub-region SB2 and electrically connecting between the read-out lines ROL and the touch driving circuit 400.

Data pad lines DPDL may be densely concentrated in the first line group region LGA1 of the second sub-region SB2. Data dummy lines DDML may be densely concentrated in the second line group regions LGA2 of the second sub-region SB2. As shown in FIG. 17, the data dummy lines DDML may be on the same layer as the data pad lines DPDL. Accordingly, as shown in FIG. 14, the second line group regions LGA2 may not overlap with the first line group region LGA1.

As shown in FIG. 15, the data dummy lines DDML may extend from the bending region BA in a direction substantially parallel to the neighboring data pad lines DPDL, but may be spaced apart from the display driving circuit 200. Accordingly, as shown in FIG. 14, each of the second line group regions LGA2 may be surrounded by the bending region BA and the first line group region LGA1.

As shown in FIG. 15, read-out pad lines ROPDL may be densely concentrated in the third line group region LGA3 of the second sub-region SB2.

According to an embodiment, at least a portion of the third line group region LGA3 may overlap the second line group region LGA2. That is, in at least some areas of the third line group region LGA3, the read-out pad lines ROPDL may not overlap data pad lines DPDL electrically connected to the display driving circuit 200. Further, in at least some areas of the third line group region LGA3, the read-out pad lines ROPDL may overlap the data dummy lines DDML, which are not connected to the display driving circuit 200 and may be in a floating state.

According to an embodiment and as shown in FIG. 15, the read-out pad lines ROPDL of the third line group region LGA3 overlapping the second line group region LGA2 may be relatively sparsely concentrated, and the read-out pad lines ROPDL of the third line group region LGA3 overlapping the first line group LGA1 may be relatively densely concentrated. For example, the read-out pad lines ROPDL may fan-out in a portion of the third line group region LGA3 overlapping the second line group region LGA2. The densely concentrated read-out pad lines ROPDL of the third line group region LGA3 overlapping the first line group LGA1 may reduce an area of the overlap and reduce a defect in which light sensing signals of the read-out pad lines ROPDL may be distorted. For example, distortion of the light sensing signals of the read-out pad lines ROPDL due to the data signals of the data pad lines DPDL can be reduced.

As shown in FIG. 14 and FIG. 15, the circuit layer 120 of the display device 100 according to an embodiment may further include direct current power supply lines DCSPL (VDSPL of FIG. 14, VSSPL, VISPL, VAISPL of FIG. 15) and direct current power pad lines DCPDL (VDPDL of FIG. 14, VSPDL, VIPDL, VAIPDL of FIG. 15). The direct current power supply lines DCSP may extend from the non-display area NDA to the first sub-region SB1 and transmit direct current powers (ELVDD, ELVSS, VINT of FIG. 9 and VAINT of FIG. 10) of different voltage levels. The direct current power pad lines DCPDL may be disposed in the second sub-region SB2 and electrically connected to the direct current power supply lines DCSPL (VDSPL, VSSPL, VISPL, VAISPL), respectively. For example, the direct current power sources may include a first power ELVDD and a second power ELVSS for driving the light emitting elements LE, a first initialization power VINT for initializing the light emitting pixel drivers EPDs, and a second initialization power VAINT for initializing the light sensing pixel drivers DPD.

According to an embodiment, the third line group region LGA3 may include another partial area that overlaps the first line group region LGA1. Some other areas of the third line group region LGA3 that overlap with the first line group region LGA1 may also overlap the direct current power pad lines DCPDL. That is, another partial area of the third line group region LGA3 may overlap with the first line group region LGA1 and the direct current power pad lines DCPDL.

In some other areas of the third line group region LGA3 overlapping with the first line group region LGA1, the read-out pad lines ROPDL may overlap the data pad lines DPDL of the first line group region LGA1 and the direct current power pad lines DCPDL. Accordingly, in some other areas of the third line group region LGA3 overlapping with the first line group region LGA1, the light sensing signals of the read-out pad lines ROPDL can be maintained relatively stable by the direct current power supplies ELVDD, ELVSS, VINT, and VAINT of the direct current power pad lines DCPDL, and have relatively little interference from data signals of data pad lines DPDL. Accordingly, distortion of light sensing signals of the read-out pad lines ROPDL can be reduced.

According to an embodiment, the circuit layer 120 may further include data supply lines DSPL extending from the non-display area NDA to the first sub-region SB1 and electrically connected respectively to the data lines DL of the display area DA, and direct current power supply lines (DCSPL: VDSPL, VSSPL, VISPL, VAISPL) disposed in the non-display area NDA and the first sub-region SB1 and respectively transmitting direct current powers of different voltage levels.

The direct current power supply lines DCSPL may include a first power supply line VDSPL transmitting the first power ELVDD, a second power supply line VSSPL transmitting the second power ELVSS, a first initialization power supply line VISPL transmitting a first initialization power VINT, and a second initialization power supply line VAISPL transmitting a second initialization power VAINT.

In addition, although not separately shown, the direct current power supply lines DCSPL may further include gate level powers supplied to the gate driving circuit 101 and the emission control circuit 102.

Also, according to an embodiment, the circuit layer 120 may further include bending lines BDL disposed in the bending region BA and electrically connecting the lines of the first sub-region SB1 and the line of the second sub-region SB2, respectively.

The bending lines BDL may include data bending lines DBDL, at least one first power bending line VDBDL, at least one second power bending line VSBDL, at least one first initialization power bending line VIBDL, and at least one second initialization power bending line VAIBDL. The data bending lines DBDL may electrically connect between the data supply lines DSPL and data pad lines DPDL, respectively. The at least one first power bending line VDBDL may electrically connect between the first power supply line VDSPL and the first power pad line VDPDL. The at least one second power bending line VSBDL may electrically connect between the second power supply line VSSPL and the second power pad line VSPDL. The at least one first initialization power bending line VIBDL may electrically connect between the first initialization power supply line VISPL and the first initialization power pad line VIPDL. The at least one second initialization power bending line VAIBDL may electrically connect between the second initialization power supply line VAISPL and the second initialization power pad line VAIPDL.

According to an embodiment, the read-out pad lines ROPDL may extend to the bending region BA, the first sub-region SB1 and the non-display area NDA, and may be respectively connected to the read-out lines ROL of the display area DA. However, this is merely an example, and the display device 100 of an embodiment is not limited thereto. That is, according to an embodiment, the read-out lines ROL may be electrically connected to read-out pad lines ROPDL, respectively, through read-out connection lines (not shown) disposed in the non-display area NDA and the first sub-region SB1 and read-out bending lines (not shown) of the bending region BA.

Referring to FIG. 16, the display device 100 according to an embodiment may further include a bending hole BDH, which corresponds to the bending region BA, and a bank BNK, which covers the bending hole BDH. The bending hole BDH may penetrate inorganic layers including a buffer layer 121, a first gate insulating layer 122, a second gate insulating layer 123, first interlayer insulating layer 124, a third gate insulating layer 125, and a second interlayer insulating layer 126 among the circuit layer 120.

The bending hole BDH is used to remove inorganic layers that are relatively vulnerable to bending stress from the bending region BA.

The bank BNK is used for protecting the bending lines in the bending hole BDH and bending region BA. In addition, the bank BNK may be a spacer that supports a fine pattern mask for arranging the light emitting layer 133 of the light emitting elements LE among the element layers 130 and the photoelectric conversion layer (not shown) of the light sensing elements PD.

The bank BNK may extend to the first sub-region SB1 or the second sub-region SB2. The bank BNK may include bank layers each formed of organic layers. For example, the bank BNK may include a first bank layer BNL1 made of the same layer as the first planarization layer 127, and a second bank layer BNL2 covering the first bank layer BNL1 and made of the same layer as the second planarization layer 128. In an embodiment, the bank BNK may further include a third bank layer BNL3 disposed on the second bank layer BNL2 and made of the same layer as the third planarization layer 129. In an embodiment, the bank BNK may further include a fourth bank layer (not shown) disposed on the third bank layer BNL3 and made of the same layer as the pixel defining layer 132.

Each of the data supply lines DSPL of the first sub-region SB1 and the data pad lines DPDL of the second sub-region SB2 may be included in one of the first gate conductive layer on the first gate insulating layer 122 and the second gate conductive layer on the second gate insulating layer 123.

Similar to the data pad lines DPDL, each of the data dummy lines DDML may be included in one of the first gate conductive layer on the first gate insulating layer 122 and the second gate conductive layer on the second gate insulating layer 123.

Bending lines BDL (see FIG. 15: DBDL, VSBDL, VDBDL, VIBDL, and VAIBDL) of the bending region BA may be disposed on the first bank layer BNL1. That is, the bending lines BDL (DBDL, VSBDL, VDBDL, VIBDL, and VAIBDL) of the bending region BA may be included in the second source/drain conductive layer on the first planarization layer 127.

The data bending line DBDL may be electrically connected to the data supply line DSPL through a first data connection hole DCH1 and may be electrically connected to the data pad line DPDL through a second data connection hole DCH2.

Each of the first data connection hole DCH1 and the second data connection hole DCH2 may penetrate the first bank layer BNL1, the second interlayer insulating layer 126, the third gate insulating layer 125, and the first interlayer insulating layer 124, or may further penetrate the second gate insulating layer 123.

Each of the direct current power pad lines DCPDL and the direct current power supply lines VDSPL, VSSPL, VISPL, and VAISPL may be disposed on the second interlayer insulating layer 126 covering the data pad lines DPDL and data dummy lines DDML. That is, each of the direct current power pad lines DCPDL and the direct current power supply lines VDSPL, VSSPL, VISPL, and VAISPL may include a first line layer included in the first source/drain conductive layer on the second interlayer insulating layer 126. For example, among the direct current power pad lines DCPDL, the second power pad line VSPDL transmitting the second power ELVSS may be disposed on the second interlayer insulating layer 126.

The second power bending line VSBDL may be disposed on the first bank layer BNL1, may be electrically connected to the second power supply line VSSPL through a first power connection hole VCH1, and may be connected to the second power pad line VSPDL through a second power connection hole VCH2.

When the second power supply line VSSPL and the second power pad line VSPDL are disposed on the second interlayer insulating layer 126, each of the first power connection hole VCH1 and the second power connection hole VCH2 may penetrate the first bank layer BNL1.

Referring to FIG. 17, the read-out pad lines ROPDL may be disposed on the first bank layer BNL1 covering the direct current power pad lines DCPDL (VDPDL, VSPDL, VIPDL, and VAIPDL). That is, the read-out pad lines ROPDL may be included in a second source/drain conductive layer on the first planarization layer 127.

At least some areas of the third line group region LGA3 where the read-out pad lines ROPDL are densely concentrated may overlap the second line group regions LGA2, and other remaining areas may overlap the first line group region LGA1. In some areas of the third line group region LGA3 that overlap the second line group regions LGA2, the read-out pad lines ROPDL may overlap the dummy data lines DDML. Additionally, in some areas of the third line group region LGA3 that overlap the second line group regions LGA2, the read-out pad lines ROPDL may directly overlap the dummy data lines DDML.

In other words, the dummy data lines DDML may be in a floating state and may not be electrically connected to the display driving circuit 200. Accordingly, even in areas where the read-out pad lines ROPDL directly overlap the dummy data lines DDML, the light sensing signals of the read-out pad lines ROPDL may not be significantly distorted.

In some areas of the third line group region LGA3 overlapping the first line group region LGA1, the read-out pad lines ROPDL may overlap the data pad lines DPDL of the first line group region LGA1, and also overlap the direct current power pad lines DCPDL. That is, in some areas of the third line group region LGA3 overlapping the first line group region LGA1, the direct current power pad lines DCPDL may be interposed in the third direction DR3 between the read-out pad lines ROPDL and the data pad lines DPDL.

In this way, the electrical influence of the data signals of the data pad lines DPDL on the light sensing signals of the read-out pad lines ROPDL can be shielded by the direct current power pad lines DCPDL. Thus, even if the read-out pad lines ROPDL overlap the data pad lines DPDL, the distortion of the light sensing signals of the read-out pad lines ROPDL can be reduced.

The read-out pad lines ROPDL may be covered with the second bank layer BNL2.

Alternatively, when the bank BNK further includes the third bank layer BNL3, the read-out pad lines ROPDL may be covered with the second bank layer BNL2 and the third bank layer BNL3.

Meanwhile, since the display device 100 according to an embodiment includes the touch sensor layer 150, the circuit layer 120 may further include touch sensor pad lines TSPDL (see FIG. 19) disposed in the second sub-region SB2 and electrically connecting between the touch sensor lines TSL (see FIG. 11) of the touch sensor layer 150 and the touch driving circuit 400. In this case, light sensing signals of the read-out pad lines ROPDL may be distorted by the touch driving signal and touch sensing signal (hereinafter, collectively referred to as "touch signal") of the touch sensor pad lines TSPDL.

Accordingly, an embodiment provides a display device 100 that can shield the electrical interference of touch signals of touch sensor pad lines TSPDL on light sensing signals of read-out pad lines ROPDL.

Figure 18:
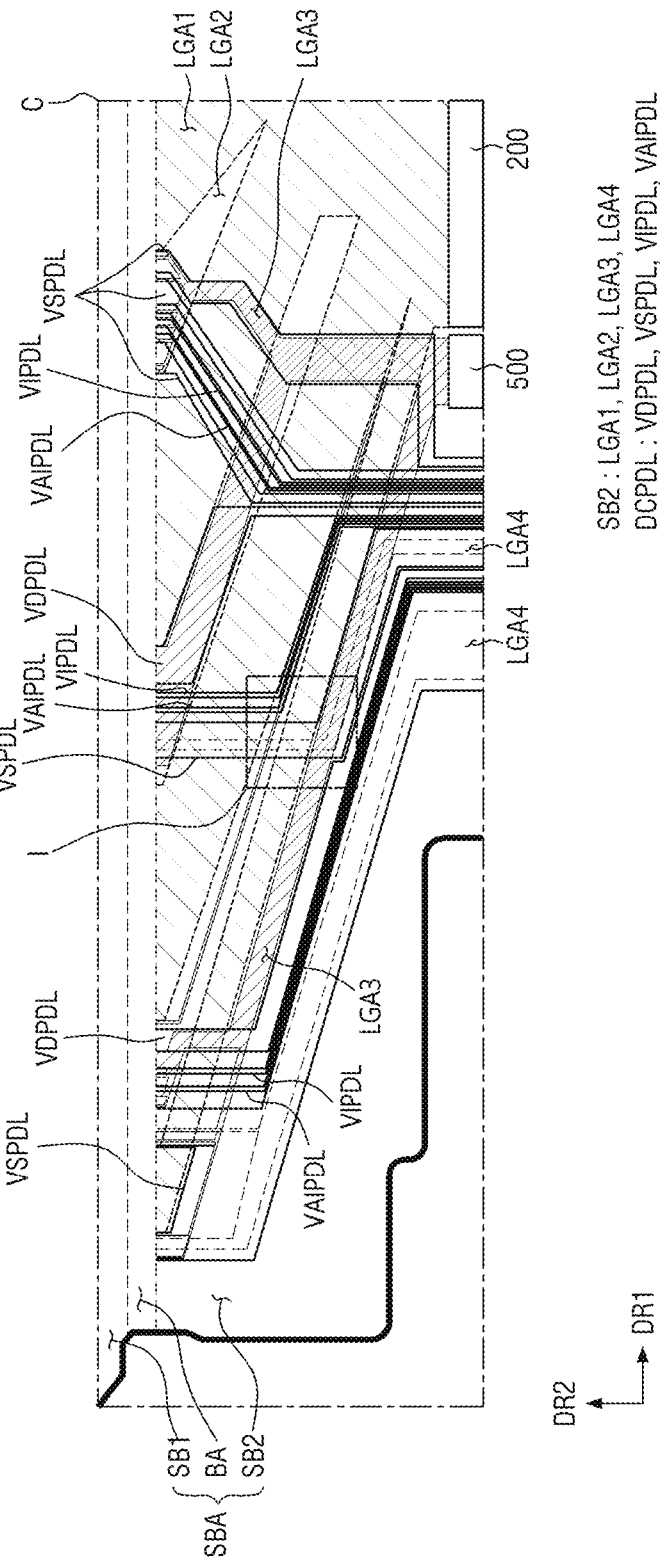
FIG. 18 is a plan view showing part C of FIG. 5 according to an embodiment.
Figure 19:
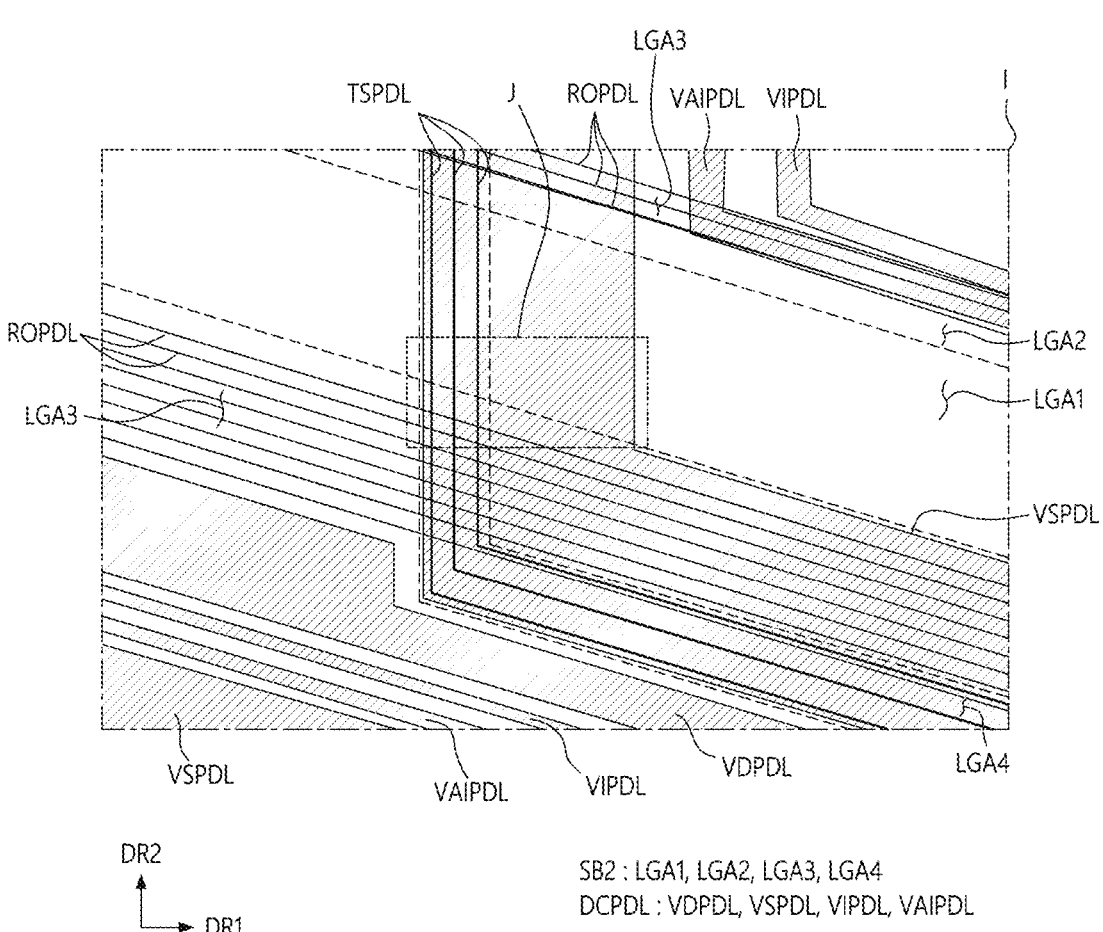
FIG. 19 is a plan view showing part I of FIG. 18.
Figure 20:
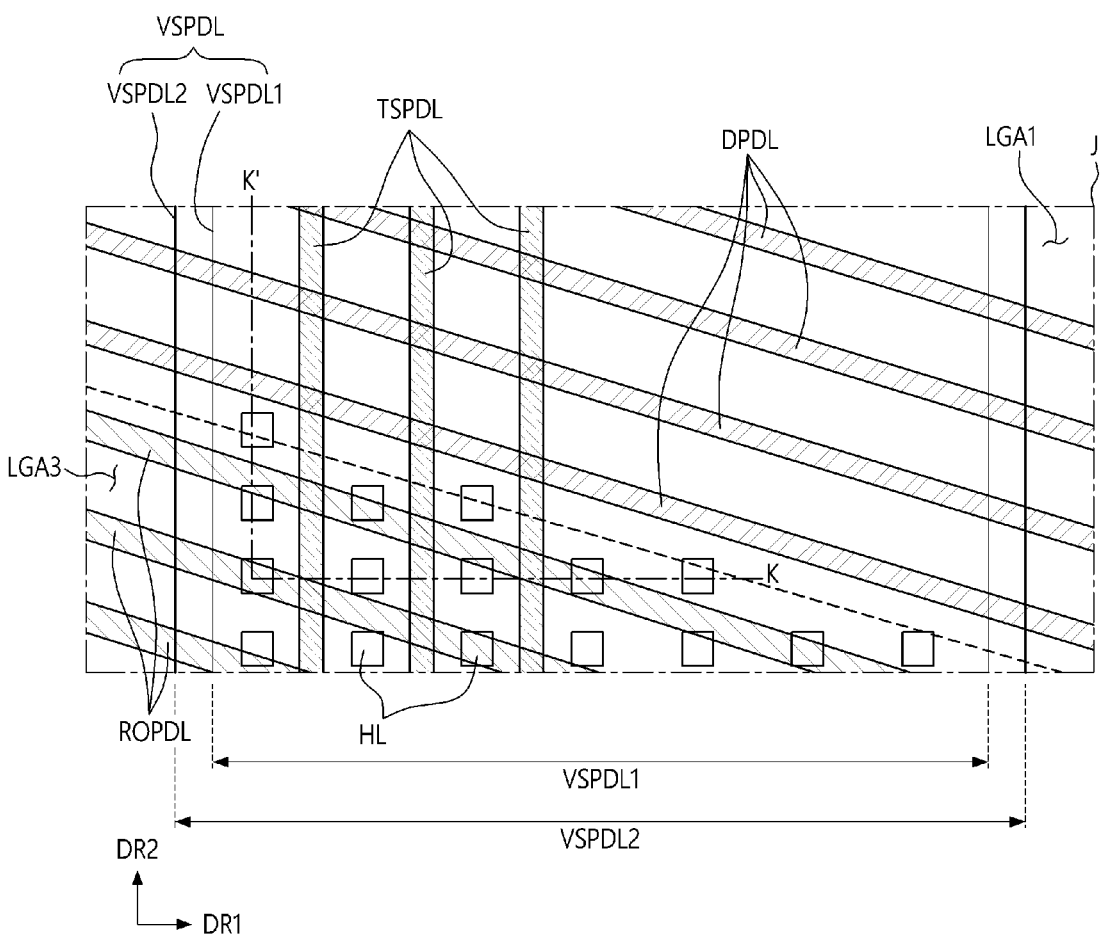
FIG. 20 is an enlarged view of part J of FIG. 19.
Figure 21:
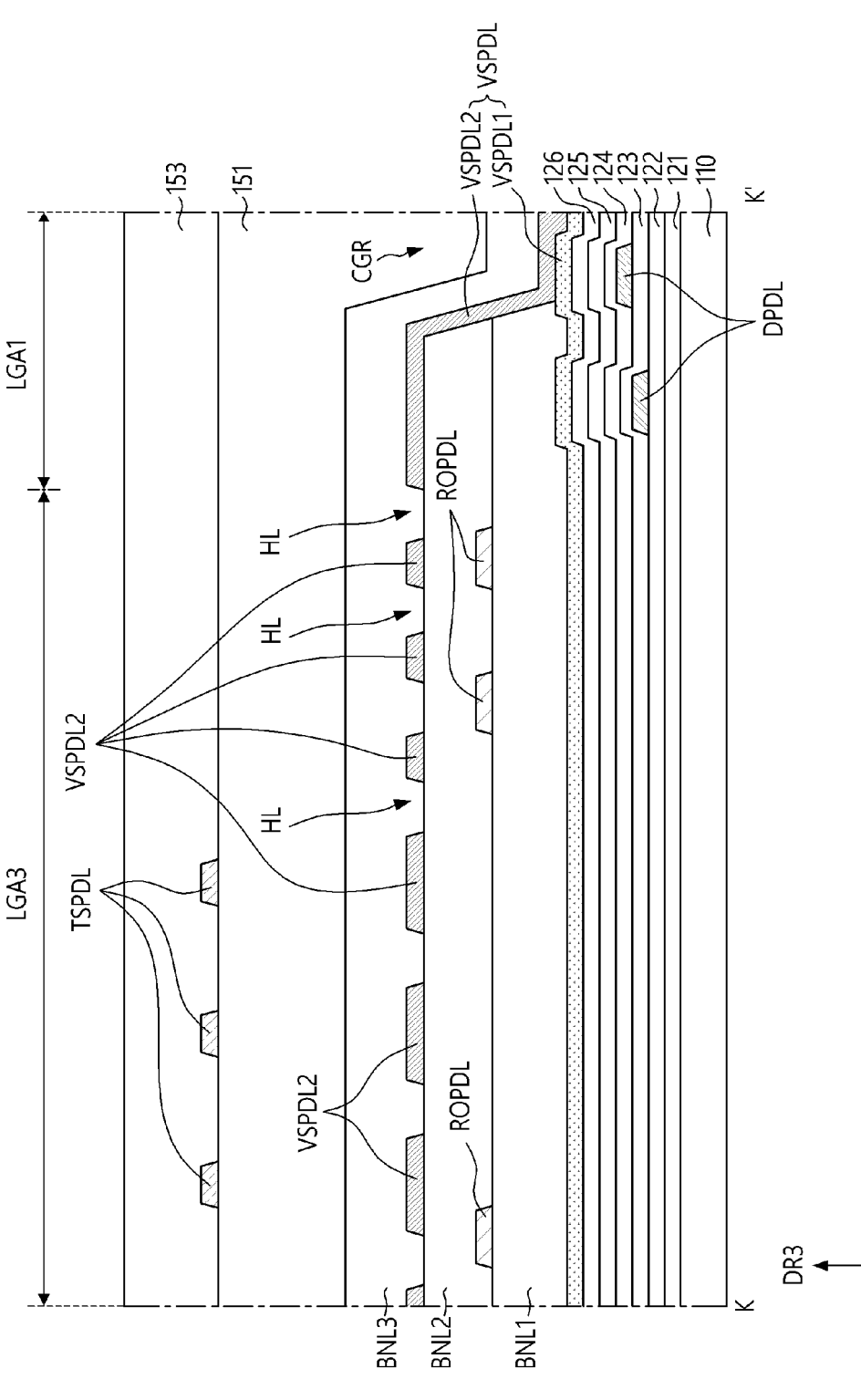
FIG. 21 is a cross-sectional view taken along line K-K' of FIG. 20.

FIG. 18 is a plan view showing part C of FIG. 5 according to an embodiment. FIG. 19 is a plan view showing part I of FIG. 18. FIG. 20 is an enlarged view of part J of FIG. 19. FIG. 21 is a cross-sectional view taken along line K-K' of FIG. 20.

Referring to FIG. 18 and FIG. 19, the circuit layer 120 of the display device 100 according to an embodiment may further include touch sensor pad lines TSPDL disposed in the second sub-region SB2 and electrically connected to the touch sensor lines TSL of the touch sensor layer 150, respectively.

The touch sensor pad lines TSPDL electrically connects between the touch sensor lines TSL of the touch sensor layer 150 and a touch driving circuit 400.

The second sub-region SB2 may further include a fourth line group region LGA4 in which touch sensor pad lines TSPDL are densely concentrated.

According to an embodiment, the fourth line group region LGA4 may overlap the direct current power pad lines (DCPDL: VDPDL, VSPDL, VIPDL, VAIPDL). In addition, the third line group region LGA3 may include some areas overlapping the fourth line group region LGA4. Accordingly, a portion of the third line group region LGA3 that overlaps the fourth line group region LGA4 may overlap the touch sensor pad lines TSPDL and direct current power pad lines DCPDL of the fourth line group region LGA4.

Referring to FIG. 20 and FIG. 21, each of at least some of the direct current power pad lines DCPDL of the circuit layer 120 of the display device 100 according to an embodiment may include a first line layer disposed on the second interlayer insulating layer 126 and a second line layer disposed on the second bank layer BNL2 covering the read-out pad lines ROPDL.

For example, among the direct current power pad lines DCPDL, the second power pad line VSPDL may include a first line layer VSPDL1 disposed on the second interlayer insulating layer 126 and a second line layer VSPDL2 disposed on the second bank layer BNL2.

Among the direct current power pad lines DCPDL, since the remaining first and second line layers except for the second power pad line VSPDL are the same as the second power pad line VSPDL, the redundant descriptions may be omitted below.

The second line layer VSPDL2 may overlap the first line layer VSPDL1.

In addition, according to an embodiment, the touch sensor pad lines TSPDL may be disposed on a buffer planarizing layer 151 covering the second line layer VSPDL2.

As another example, in the second sub-region SB2, the second line layer VSPDL2 may be covered with the third bank layer BNL3, and the buffer planarizing layer 151 may be disposed on the third bank layer BNL3.

The touch sensor pad lines TSPDL may overlap at least a portion of the second line layer VSPDL2 among the direct current power pad lines DCPDL.

Accordingly, among the third line group region LGA3 where the read-out pad lines ROPDL are densely concentrated, other areas overlapping the fourth line group region LGA4 where the touch sensor pad lines TSPDL may be densely concentrated may overlap the second line layer VSPDL2.

In other words, in another part of the third line group region LGA3, the second line layer VSPDL2 may be interposed between the read-out pad lines ROPDL and the touch sensor pad lines TSPDL. In this way, the touch signals of the touch sensor pad lines TSPDL may be shielded from the light sensing signals of the read-out pad lines ROPDL. Thus, distortion of the light sensing signals of the read-out pad lines ROPDL due to the touch signal of the touch sensor pad lines TSPDL, can be reduced or prevented.

Meanwhile, the second line layer VSPDL2 may be electrically connected to the first line layer VSPDL1 through a connection groove CGR penetrating the first bank layer BNL1 and the second bank layer BNL2. For example, a connection groove CGR may be arranged in a linear form extending parallel to a portion of the overlapping area between the first line layer VSPDL1 and the second line layer VSPDL2. In this way, the resistance between the first line layer VSPDL1 and the second line layer VSPDL2 can be further lowered, and the line resistance can be lowered.

In addition, since the outgassing of the organic insulating material included in the first bank layer BNL1 and the second bank layer BNL2 can be reduced or eliminated, a lifting defect or an oxidation defect of the conductive layer due to the outgassing can be reduced or prevented.

According to an embodiment, since the read-out pad lines ROPDL may be densely concentrated in the third line group region LGA3 of the second sub-region SB2 disposed on the first bank layer BNL1, the connection groove VCH3 may be spaced apart from the third line group region LGA3 for the arrangement of the read-out pad lines ROPDL. In other words, in the third line group region LGA3, the second line layer VSPDL2 may not contact the first line layer VSPDL1 through the connection groove CGR, and the second line layer VSPDL2 may be disposed on the second bank layer BNL2.

According to an embodiment, the display device 100 according to an embodiment may further include holes HL disposed in the third line group region LGA3, spaced apart from each other, and penetrating the second line layer VSPDL2. Since the holes HL penetrate the second line layer VSPDL2 and expose the second bank layer BNL2, a gas released by the organic insulating material included in the first bank layer BNL1 and the second bank layer BNL2 may be emitted through holes HL. According to an embodiment, defects due to a trapping of gasses released by the organic insulating material can be reduced or eliminated.

In addition, according to an embodiment, the touch sensor pad lines TSPDL may be spaced apart from the holes HL. In this way, the read-out pad lines ROPDL can be prevented from directly overlapping the touch sensor pad lines TSPDL through the holes HL.

In an embodiment, the light sensing signals of the read-out pad lines ROPDL may not distorted by the touch signal of the touch sensor pad lines TSPDL.

In concluding the detailed description, those skilled in the art will appreciate that many variations and modifications can be made to embodiments without substantially departing from the principles of the present invention. Therefore, embodiments of the invention are used in a generic and descriptive sense only and not for purposes of limitation.

The effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
a substrate including a display area, and a non-display area disposed at a periphery of the display area;
a circuit layer disposed on the substrate; and
an element layer disposed on the circuit layer and comprising a plurality of light emitting elements and a plurality of light sensing elements,
wherein the substrate further includes a sub-region protruding from the non-display area and on which a display driving circuit and a scan driving circuit are mounted,
wherein the circuit layer comprises:
a plurality of light emitting pixel drivers electrically connected to the plurality of light emitting elements;
a plurality of light sensing pixel drivers electrically connected to a plurality of light sensing elements;
a plurality of data lines disposed in the display area and electrically connected to a plurality of light emitting pixel drivers;
a plurality of read-out lines disposed in the display area and electrically connected to the plurality of light sensing pixel drivers;
a plurality of data pad lines disposed in the sub-region and electrically connecting between the plurality of data lines and the display driving circuit; and
a plurality of read-out pad lines disposed in the sub-region and electrically connecting between the plurality of read-out lines and the scan driving circuit, wherein the sub-region comprises:
a first line group region in which the plurality of data pad lines are disposed;
a second line group region disposed in the sub-region and spaced apart from the display driving circuit, wherein the second line group region is a dummy region; and
a third line group region in which the plurality of read-out pad lines are disposed,
wherein at least a portion of the third line group region overlaps the second line group region.

2. The display device of claim 1, further comprising a plurality of data dummy lines disposed in the second line group region and on a same layer of the circuit layer as the plurality of data pad lines,
wherein the second line group region is surrounded by the first line group region in the sub-region,
wherein at least a portion of the third line group region overlaps the first line group region, and
wherein the plurality of read-out pad lines of the third line group region overlapping the second line group region are relatively sparsely concentrated and the plurality of read-out pad lines of the third line group region overlapping the first line group region are relatively densely concentrated.

3. The display device of claim 2, wherein the circuit layer further comprises:
a plurality of direct current power supply lines extending from the non-display area to the sub-region and transmitting direct current powers of different voltage levels; and
a plurality of direct current power pad lines disposed in the sub-region and electrically connected to the plurality of direct current power supply lines, respectively,
wherein, in a portion of the third line group region overlapping the first line group region, the plurality of read-out pad lines overlap the plurality of data pad lines of the first line group region and the plurality of direct current power pad lines.

4. The display device of claim 3, further comprising a plurality of holes disposed in the third line group region and penetrating the plurality of direct current power pad lines.

5. A display device comprising:

a substrate including a main region and a sub-region protruding from a side of the main region;

a circuit layer disposed on the substrate; and an element layer disposed on the circuit layer, wherein the main region includes a display area disposed at a center portion and a non-display area disposed at a periphery of the display area, wherein the sub-region comprises:

a bending region;

a first sub-region disposed between a first side of the bending region and the main region; and a second sub-region connected to a second side of the bending region and on which a display driving circuit and a scan driving circuit are mounted, wherein the display area comprises:

a plurality of emission areas spaced apart from each other;

a non-emission area which is a space between the plurality of emission areas; and a plurality of light sensing areas disposed on the non-emission area, wherein the element layer comprises a plurality of light emitting elements disposed in the plurality of emission areas and a plurality of light sensing elements disposed in the plurality of light sensing areas, wherein the circuit layer comprises:

a plurality of light emitting pixel drivers electrically connected to the plurality of light emitting elements;

a plurality of light sensing pixel drivers electrically connected to the plurality of light sensing elements;

a plurality of data lines disposed in the display area and electrically connected to the plurality of light emitting pixel drivers;

a plurality of read-out lines disposed in the display area and electrically connected to the plurality of light sensing pixel drivers;

a plurality of data pad lines disposed in the second sub-region and electrically connecting between the plurality of data lines and the display driving circuit; and a plurality of read-out pad lines disposed in the second sub-region and electrically connecting between the plurality of read-out lines and the scan driving circuit, wherein the second sub-region comprises:

a first line group region in which the plurality of data pad lines are disposed;

at least one second line group region, extending from the bending region, and spaced apart from the display driving circuit, wherein the at least one second line group region is a dummy region; and a third line group region in which the plurality of read-out pad lines are disposed, and wherein at least a portion of the third line group region overlaps the at least one second line group region.

6. The display device of claim 5, further comprising a plurality of data dummy lines disposed in the at least one second line group region and extending from the bending region, wherein the plurality of data dummy lines are on a same layer of the circuit layer as the plurality of data pad lines, and wherein each second line group region of the at least one second line group region is surrounded by the bending region and the first line group region.

7. The display device of claim 6, wherein the circuit layer further comprises:

a plurality of direct current power supply lines extending from the non-display area to the first sub-region and transmitting direct current powers of different voltage levels; and a plurality of direct current power pad lines disposed in the second sub-region and electrically connected to the plurality of direct current power supply lines, respectively, wherein, in a portion of the third line group region overlapping the first line group region, at least one of the plurality of read-out pad lines overlaps at least one of the plurality of data pad lines of the first line group region and at least one of the plurality of direct current power pad lines.

8. The display device of claim 7, wherein the plurality of direct current power pad lines are disposed on an interlayer insulating layer covering the plurality of data pad lines and the plurality of data dummy lines, wherein the plurality of read-out pad lines are disposed on a first bank layer covering the plurality of direct current power pad lines, and wherein, in the portion of the third line group region overlapping the first line group region, at least one of the plurality of direct current power pad lines is interposed between the at least one of the plurality of read-out pad lines and at least one of the plurality of data pad lines.

9. The display device of claim 7, further comprising:

an encapsulation layer disposed on the element layer; and a touch sensor layer disposed on the encapsulation layer, wherein the circuit layer further comprises a plurality of touch sensor pad lines disposed in the second sub-region and electrically connecting a plurality of touch sensor lines of the touch sensor layer, respectively, wherein the second sub-region further comprises a fourth line group region in which the plurality of touch sensor pad lines are disposed, wherein at least a first direct current power pad lines among the plurality of direct current power pad lines comprises a first line layer and a second line layer overlapping each other, wherein the first line layer is disposed on an interlayer insulating layer covering the plurality of data pad lines and the plurality of data dummy lines, wherein the plurality of read-out pad lines are disposed on a first bank layer covering the first line layer, wherein the second line layer is disposed on a second bank layer covering the plurality of read-out pad lines, and wherein, in a portion of the third line group region overlapping the fourth line group region, the plurality of read-out pad lines overlap the plurality of touch sensor pad lines of the fourth line group region and the second line layer.

10. The display device of claim 9, wherein the plurality of touch sensor pad lines are disposed on a buffer planarizing layer covering the second line layer and overlap the second line layer, and wherein, in the portion of the third line group region overlapping the fourth line group region, the second line layer is interposed between the plurality of read-out pad lines and the plurality of touch sensor pad lines.

11. The display device of claim 10, further comprising a plurality of holes disposed in the third line group region, spaced apart from each other, and penetrating the second line layer, wherein the plurality of touch sensor pad lines are spaced apart from the plurality of holes.

12. The display device of claim 7, wherein the direct current powers comprise:

a first power and a second power for driving a plurality of light emitting pixels;

a first initialization power for initializing the plurality of light emitting pixel drivers; and a second initialization power for initializing the plurality of light sensing pixel drivers.

13. An electronic device comprising:

a bracket;

a display device disposed on the bracket and emitting light for an image display; and a cover window disposed on the display device, wherein the display device comprises:

a substrate including a main region and a sub-region protruding from a side of the main region;

a circuit layer disposed on the substrate;

an element layer disposed on the circuit layer;

an encapsulating layer disposed on the element layer; and a touch sensor layer disposed on the encapsulating layer, wherein the main region comprises a display area disposed at a center portion and a non-display area disposed at a periphery of the display area, wherein the sub-region comprises:

a bending region having a bent form;

a first sub-region disposed between a first side of the bending region and the main region; and a second sub-region connected to a second side of the bending region and on which a display driving circuit and a scan driving circuit are mounted, wherein the display area comprises:

a plurality of emission areas spaced apart from each other;

a non-emission area which is a space between the plurality of emission areas; and a plurality of light sensing areas disposed on the non-emission area, wherein the element layer comprises a plurality of light emitting elements disposed in the plurality of emission areas and a plurality of light sensing elements disposed in the plurality of light sensing areas, wherein the circuit layer comprises:

a plurality of light emitting pixel drivers electrically connected to the plurality of light emitting elements;

a plurality of light sensing pixel drivers electrically connected to the plurality of light sensing elements;

a plurality of data lines disposed in the display area and electrically connected to the plurality of light emitting pixel drivers;

a plurality of read-out lines disposed in the display area and electrically connected to the plurality of light sensing pixel drivers;

a plurality of data pad lines disposed in the second sub-region and electrically connecting between the plurality of data lines and the display driving circuit;

a plurality of data dummy lines disposed in the second sub-region, extending from the bending region, and spaced apart from the display driving circuit; and a plurality of read-out pad lines disposed in the second sub-region and electrically connecting between the plurality of read-out lines and the scan driving circuit, wherein the second sub-region comprises:

a first line group region in which the plurality of data pad lines are disposed;

42 a second line group region in which the plurality of data dummy lines are disposed and spaced apart from each other; and a third line group region in which the plurality of read-out pad lines are disposed, wherein at least a portion of the third line group region overlaps the second line group region.

14. The electronic device of claim 13, wherein the plurality of data dummy lines are on a same layer of the circuit layer as the plurality of data pad lines, wherein the second line group region is surrounded by the bending region and the first line group region, and wherein the circuit layer further comprises:

a plurality of direct current power supply lines extending from the non-display area to the first sub-region and transmitting direct current powers of different voltage levels; and a plurality of direct current power pad lines disposed in the second sub-region and electrically connected to the plurality of direct current power supply lines, respectively, wherein, in a portion of the third line group region overlapping the first line group region, the plurality of read-out pad lines overlap the plurality of data pad lines of the first line group region and the plurality of direct current power pad lines.

15. The electronic device of claim 14, wherein the plurality of direct current power pad lines are disposed on an interlayer insulating layer covering the plurality of data pad lines and the plurality of data dummy lines, wherein the plurality of read-out pad lines are disposed on a first bank layer covering the plurality of direct current power pad lines, and wherein, in the portion of the third line group region overlapping the first line group region, the plurality of direct current power pad lines are interposed between the plurality of read-out pad lines and the plurality of data pad lines.

16. The electronic device of claim 14, wherein the circuit layer further comprises a plurality of touch sensor pad lines disposed in the second sub-region and electrically connected to a plurality of touch sensor lines of the touch sensor layer, respectively, wherein the second sub-region further comprises a fourth line group region in which the plurality of touch sensor pad lines are disposed, wherein at least one direct current power pad line among the plurality of direct current power pad lines comprises a first line layer and a second line layer overlapping each other, wherein the first line layer is disposed on an interlayer insulating layer covering the plurality of data pad lines and the plurality of data dummy lines, wherein the plurality of read-out pad lines are disposed on a first bank layer covering the first line layer, wherein the second line layer is disposed on a second bank layer covering the plurality of read-out pad lines, and wherein, in a portion of the third line group region overlapping the fourth line group region, the plurality of read-out pad lines overlap the plurality of touch sensor pad lines of the fourth line group region and the second line layer.

17. The electronic device of claim 16, wherein the plurality of touch sensor pad lines are disposed on a buffer planarizing layer covering the second line layer and overlap the second line layer, and wherein, in the portion of the third line group region overlapping the fourth line group region, the second line layer is interposed between the plurality of read-out pad lines and the plurality of touch sensor pad lines.

18. The electronic device of claim 14, wherein the direct current powers comprise:

a first power and a second power for driving a plurality of light emitting pixels;

a first initialization power for initializing the plurality of light emitting pixel drivers; and a second initialization power for initializing the plurality of light sensing pixel drivers.

\* \* \* \* \*